United States Patent [19]
Algrain et al.

[11] Patent Number: 5,710,720
[45] Date of Patent: Jan. 20, 1998

[54] PHASE LOCK LOOP BASED SYSTEM AND METHOD FOR DECOMPOSING AND TRACKING DECOMPOSED FREQUENCY COMPONENTS OF A SIGNAL, WITH APPLICATION TO VIBRATION COMPENSATION SYSTEM

[75] Inventors: Marcelo C. Algrain; Steven L. Hardt; Douglas E. Ehlers, all of Lincoln, Nebr.

[73] Assignee: Board of Regents of the University of Nebraska, Lincoln, Nebr.

[21] Appl. No.: 691,927

[22] Filed: Aug. 1, 1996

[51] Int. Cl.$^6$ ............................. G01M 7/00; H04L 7/08
[52] U.S. Cl. ................... 364/574; 364/508; 375/376; 375/326; 367/189; 73/579
[58] Field of Search ............... 364/574, 551.02, 364/484–485, 572, 508, 221, 221.8; 381/71, 94, 97, 98; 375/376, 326, 327; 367/189, 135, 190; 318/116–117; 324/76.19, 76.21, 76.22, 76.24, 76.31, 76.29

[56] References Cited

U.S. PATENT DOCUMENTS

| | | | |
|---|---|---|---|
| 3,657,630 | 4/1972 | Fiet | 318/676 |
| 4,432,242 | 2/1984 | Thompson et al. | 73/861.22 |
| 4,566,118 | 1/1986 | Chaplin et al. | 381/71 |
| 4,649,496 | 3/1987 | Anderson et al. | 364/485 |
| 4,849,989 | 7/1989 | Kamerman | 375/13 |
| 4,998,163 | 3/1991 | Salvati | 358/42 |
| 5,060,519 | 10/1991 | Chojitani et al. | 73/662 |
| 5,134,348 | 7/1992 | Izukawa et al. | 318/116 |
| 5,170,433 | 12/1992 | Elliott et al. | 381/47 |
| 5,233,540 | 8/1993 | Anderson et al. | 364/508 |
| 5,245,552 | 9/1993 | Andersson et al. | 364/508 |
| 5,291,967 | 3/1994 | Aoki | 180/312 |
| 5,396,561 | 3/1995 | Popvich et al. | 381/71 |
| 5,412,583 | 5/1995 | Cameron et al. | 364/508 |
| 5,442,593 | 8/1995 | Woodbury et al. | 367/135 |
| 5,606,581 | 2/1997 | Myers | 375/376 |
| 5,648,964 | 7/1997 | Inagaki et al. | 375/376 |

OTHER PUBLICATIONS

National Semiconductor Phase Lock Loop Data Sheets LM565/LM565L.
Motorola Phase Lock Loop Data Sheets MC54/74H6–4046A.
National Semiconductor D to A Converter Data Sheets, DAo8301DA0831/DAC0832 8–Bit NP.
National Semiconductor Universal Switched Capacitor Filter MF–10.

*Primary Examiner*—Emanuel T. Voeltz
*Assistant Examiner*—Bryan Bui
*Attorney, Agent, or Firm*—James D. Welch

[57] ABSTRACT

Disclosed is a system for decomposing an original signal of arbitrary frequency content into a user determined plurality of signals, each of which signals is centered about a variable center frequency. The system of the present invention utilizes a Bank of a plurality of combination Phase Lock Loop and associated Band Pass Filter Bank Components, the Center Frequency of a Frequency Pass Band of each of said Band Pass Filters being effected by use of a signal input thereto, and output by, an associated Phase Lock Loop. The present invention system is particularly well suited for application in the compensation of vibrations in a physical system as sensed by sensors located therein to sense feed-forward and/or feed-back vibration signals. The use of "Look-up" tables which provide magnitude and phase modification specifications for use in modifying vibration compensating actuator applied signal frequency and phase in feed-forward and in feed-back vibration compensation systems is disclosed as is the use of both feed-forward and feed-back signals in an automated vibration compensation system.

26 Claims, 8 Drawing Sheets

PHASE LOCK LOOP BASED SYSTEM AND METHOD FOR DECOMPOSING AND TRACKING DECOMPOSED FREQUENCY COMPONENTS OF A SIGNAL, WITH APPLICATION TO VIBRATION COMPENSATION SYSTEM

The present Application is Continued from Provisional application Ser. No. 60/016,551 filed Apr. 30, 1996.

TECHNICAL FIELD

The present invention is a System comprising a Plurality of User Controllable Phase Lock Loops (PLL's), each of which in use Controls one or more Band Pass Filter Center Frequencies, which System allows "Real-Time" decomposition of an Electric Signal, comprised of arbitrary frequency content, into a plurality of Electric Signals which are each centered about user desired variable Center Frequency Components. The presence of the Phase Lock Loops allow tracking of Frequency Component(s) in an Electric Signal within PLL Capture and Lock-In Ranges, (which Frequency Component might vary a bit over time), by effecting a change in an associated Band Pass Filter Center Frequency such that the Center Frequency is automatically adjusted when required. A primary example of use of said invention is in Vibration Compensating Systems, wherein vibration compensation in a physical system is effected in conjunction with use of Look-Up Tables, or by fully automated "Real-Time" Feed-Back and Feed-Forward based control systems.

BACKGROUND

The concept of using control systems to compensate vibrations in physical systems by development and application of counter-displacement of appropriate magnitude and phase is well known. As well, it is well known that a signal comprised of arbitrary frequency content can typically be decomposed into a plurality of frequency components by, for instance, Fourier Analysis. In addition, it is known that Phase Lock Loops enable a particularly relevant approach to locking onto and tracking specific frequency components in an electric signal.

As the present invention system and method of use involves electric signal decomposition into various Frequency Components, the use of Phase Lock Loops and variable Center Frequency Band Pass Filters in a system which finds particularly relevant application in vibration compensation in physical systems, a search of Patents in the area which involve such components was performed.

A Patent to Cameron et al., U.S. Pat. No. 5,412,583, while not obviating of the system of the present invention, is disclosed because it describes that a Phase Lock Loop (PLL) can be used to effect tuning of a Band Pass Filter Center Frequency and thereby cause the "Q" Sharpness thereof to remain very high when the Speed of Rotation of a Centrifuge, (vibrations from which are being sensed), changes. The purpose of the Band Pass Filters in the Cameron et al. Patent, is to filter unwanted noise frequencies away from a main Center Frequency which might drift a bit as the speed of rotation of the centrifuge involved varies a bit. The breaking of a multi-frequency component containing signal into a plurality of signals each centered on a major frequency component, in combination with Controllable Band Pass Filters is, however, not disclosed. It is noted, however, that the signal fed to a Band Pass Filter described in the Cameron et al. Patent invention is first Integrated.

Another Patent, U.S. Pat. No. 3,657,630 to Fiet was identified as both Phase Lock Loops (PLL's) and Band Pass Filters are mentioned. However, the PLL is part of an oscillator which outputs a signal corresponding to the center frequency of the Band Pass Filter. There is not control of a Band Pass Filter Center Frequency by a PLL mentioned.

Another Patent, U.S. Pat. No. 5,442,593 to Woodbury et al., describes a method for attenuating a periodic noise component in a gyro generated signal, by generating a nulling signal which has a phase, frequency and amplitude that substantially tracks the phase, frequency and amplitude of the periodic noise signal. A Sin wave of a single frequency is generated and applied via a control system to attenuate a periodic noise signal centered at the same single frequency. While this is a very interesting Patent, and describes the use of PLL's, the system described does not provide means by which to attenuate a range of frequencies present about the generated single frequency.

A Patent to Salvati, U.S. Pat. No. 4,998,163 mentions a PLL and a dynamically variable Boot Strap Filter, the combination of which are applied in start-up and maintenance of Stepping Motor speed.

Next, a Patent to Izukawa et al., U.S. Pat. No. 5,134,348 mentions Band Pass Filters, and also mention PLL's, with respect to part of a frequency multiplying circuit. However, the Band Pass Filters and the PLL have no apparent direct interaction.

Continuing a Patent to Chojitani et al., U.S. Pat. No. 5,060,519 describes an Active Control Damping Table. There is no PLL mentioned, but it obviates the application of actuator developed forces in response to signals with 180 Degrees Phase Difference to that of vibrations to damp out said vibrations.

A Patent to Aoki, U.S. Pat. No. 5,291,967 serves to show Actuators for the purpose of effecting vibration Damping.

A Patent to Thompson et al., U.S. Pat. No. 4,432,242 describes a Tunable Notch Filter for Reducing Vibration Sensitivity in Vortex Shedding Flow meters. Said system utilizes a Notch Filter rather than a Band Pass Filter, and causes it to track a vibration signal. While the concept of using a PLL in a Tunable Filter Circuit is present, the concept of using a plurality of PLL's and Band Pass Filters as in the present invention is not suggested.

Next, a Patent to Chaplin et al., U.S. Pat. No. 4,566,118 describes the use of a PLL to synchronize a signal for use in canceling vibrations via an actuator, to a source of repetitive vibrations.

Continuing, a Patent to Popovich et al., U.S. Pat. No. 5,396,561 describes the use of a PLL in a system for use in active acoustic attenuation and spectral shaping. While the Disclosure is focused upon acoustic wave cancellation and shaping, the invention can be applied to machines. The PLL, is caused to lock onto an input signal and generates a desired tone in a given phase relationship with said input signal. An error signal is derived from an error transducer or microphone and the output of the PLL by means of a summer, and the result is, by means of an adaptive filter used to generate a correction signal, which correction signal is used to generate a attenuation signal which serves, for instance, to cancel the difference between the PLL provided signal and the error signal. The PLL is used here primarily as a synchronizing means rather than to set the Center Frequency of a Band Pass Filter. The PLL signal can follow the input signal if it varies a bit, however, there is no mention of the use of a plurality of PLL's to provide a real time plurality of signals in different frequency bands.

Two Patents to Anderson et al., U.S. Pat. Nos. 5,233,540 and 5,245,552 describe Methods and Apparatus for Actively Reducing Repetitive Vibrations. Repetitive Vibrations sensed at a plurality of locations in a Structure are decomposed into a number of Frequency Components by application of a Fast Fourier Transform, and first estimate control vibrations, at the same Frequencies, are applied to said Structure. The resultant state of structure vibration is sensed and the cycle repeated. The Frequency Decomposition is accomplished mathematically. PLL's are mentioned in regard to synchronization of generated signals. While the decomposition of a signal into frequency components, and separate use of each said decomposed component separately in arriving at a control signal is disclosed by these Patents, a plurality of PLL's used simultaneously, in real time, to produce in parallel, output signals of various user determined Frequencies directly derived from a source signal is not mentioned.

Finally, a Patent to Elliott et al., U.S. Pat. No. 5,170,433 describes a system for reducing noise inside a motor car passenger compartment. The use of Adaptive Filtering carried out by microprocessors is disclosed. The invention assumes a signal containing all harmonics prevalent in the sound in a vehicle powered by an engine. Said signal is then filtered to leave only the most important and dominant harmonics. Filtering is carried out by a filter whose Center Frequency can be adjusted by an external means. Said Center Frequency is set at that of a pronounced "boom" in a car enclosure. This can be extended such that a Filter with a number of "boom" resonant frequencies, or a filter which has a frequency response which models the acoustic response of the car interiors is present. PLL's are mentioned as a means for generating sinusoids with frequencies bearing an integer relationship to a square wave signal from the engine, which frequencies are added together to form a reference signal. An alternative approach to generating a sinusoid reference signal being to use an engine derived signal to control a number of tunable oscillators, each producing a sinusoid at a selected harmonic frequency. It is stated in said 433 Patent that "A decision is made before hand as to what harmonics are to be selected; a decision which may vary from car to car".

While the identified Patents are interesting, none obviate a system wherein an Input Signal of Arbitrary Frequency Content is fed to a plurality of PLL's, which PLL's are each adjusted to cover a specific Capture Frequency Range, output from, (if said Frequency Component is present in the Input Signal of Arbitrary Frequency Content), each of which PLL's is then utilized to set a Center Frequency of a separate Band Pass Filter, each of which Band Pass Filters then serves to pass a corresponding signal, derived directly from the Input Signal, to signal conditioning, (ie. Amplitude and Phase (All-Pass Filtering Effected)), means, prior to passing said conditioned signal(s) to a summation means, which summation means feeds to, for instance, an actuator means.

As will become apparent by reference to the Disclosure of the Invention Section herein, a major distinguishing point of the present invention is that each PLL present can be set to a user selected Capture Range and Lock-In Range of Frequencies, without any constraints based upon Harmonics of major Frequency Components, as is the case in Fourier Transform approaches. For instance one PLL might be set to cover a Capture Range of Fifty (50) Hz, in the Frequency Range of One-Hundred (100) Hz and One-Hundred-Fifty (150) Hz and have a Lock-In Range of Fifty (50) Hz, while another might cover a Capture Range of One-Thousand (1000) Hz, in the Frequency Range of Two-Thousand (2000) to Three-Thousand (3000) Hz with a Lock-In Range of Fifteen-Hundred (1500) Hz. Alternatively a plurality of PLL's can be stacked, each covering a part of a total Frequency Range and each having a similar Magnitude Capture and Lock-In Range. The Ranges of Frequencies monitored by each PLL, and use of the output therefrom to set a Center Frequency of a Tunable Band Pass Filter System, are thus completely open to User control, (ie. not subject to constraints based upon Harmonics of some Primary Frequency as is the case where Signal decomposition is accomplished by a Fourier Analysis). As well, each output signal from the Band Pass Filters can be separately conditioned to have a desired Amplitude and Phase, prior to being summed into a Control Signal, which Control Signal can be applied to an Actuator Means. Automated means for accomplishing separate signal conditioning in real time are disclosed in the Detailed Description Section herein.

While the prior art provides systems which are applicable to use in compensating vibrations in physical systems, there remains need for additional, more generally applicable systems and methods of their use.

DISCLOSURE OF THE INVENTION

The present invention is basically a System comprising a Bank of Phase Lock Loop containing Bank Components, which Phase Lock Loops each have User Controlled Capture and Lock-In Ranges. Output signals from said Phase Lock Loops are, in use, caused to control the Center Frequencies of associated Band Pass Filters. The present invention System enables "Real-Time" Decomposition of a Source Signal, (comprised of an arbitrary Frequency content), into a Plurality or Multiplicity of Signals which are each centered about a user determined variable Center Frequency Component expected to be present in said Source Signal. It is to be understood that the presence of the Phase Lock Loops allows tracking of Frequency Components in a Source Signal, (within Phase Lock Loop Capture and Lock-In Ranges), which Frequency Components often "Drift" a bit over time. Said tracking is accomplished by effecting a Phase Lock Loop Square Wave Output Signal controlled change in associated Band Pass Filter Center Frequencies, such that the Center Frequency, (at which Phase Shift of a Signal exiting from said Band Pass Filter is typically Zero (0.0) Degrees), is automatically adjusted, in "Real-Time", to match a monitored Signal Frequency Component.

To properly disclose the present Invention it is first necessary to describe Phase Lock Loops. Phase Lock Loops (PLL's) are inexpensive Electronic Circuits which have the ability to selectively latch onto a certain Frequency Component in an Electric Signal, which Frequency Component is within its "Capture Range", (which can be set by external component adjustment), and provide a square wave output of the same Frequency. Should the input Signal Frequency latched onto by a PLL change a bit, (within a range of frequencies called a "Lock-In Range" of the Phase Lock Loop, which Lock-In Range is also set by external component adjustment), the output Frequency of the square wave produced by the Phase Lock Loop will directly follow, and be of a similarly changed Frequency. However, if an input Signal Frequency Component is too far removed from a Frequency within a Phase Lock Loop Capture Range thereof, the Phase Lock Loop will not Latch on thereto, and will not provide a well defined output signal. As well, if a Captured input Signal Frequency changes too much after being Captured, (goes beyond the Lock-In Range), the Phase Lock Loop will not be able to track and maintain the Latched relationship, and will fail to further respond with a well defined output signal. It is noted as well, that Phase Lock Loops also provide signals which indicate when they are Latched onto a Frequency Component in a Signal input thereto, and said "Latched" Signal can be utilized to enable other circuitry in a circuit. It should be appreciated that numerous Phase Lock Loops in a Bank thereof, can be set to numerous Center Capture Frequencies, and that each Phase Lock Loop can provide an output when an Electric Signal input thereto contains Frequencies within its Capture and Lock-In Ranges.

In general then, the present invention Basic System is a Bank of Phase Lock Loop Components which serves to, in real time, decompose an arbitrary Frequency Component Content Source Signal into a Plurality of Signals, each of which Signals represent a Frequency Component in said Source Signal, and each of which PLL output signals effects the setting, and tracking of one or more Band Pass Filter Center Frequencies in real time response to changes in an Electric Signal Frequency Component content within the Capture and Lock-In range of an Electric Signal input thereto.

A primary application of the present invention is to monitor, measure and respond to Vibrations which exist in physical systems, to the end that said Vibrations are compensated and ideally canceled out completely at some location offset from the location at which said Vibrations are sensed, by an intervening Actuator. As one non-limiting example, a Lathe might for instance be operating on a square, (in cross section), piece of stock, to the end that it, (the stock), becomes rounded, (in cross section). During this operation a Vibration with a primary frequency of four times the rotation speed of the piece of stock would be developed in the Lathe by the repeated contact of the Lathe cutting blade with the four corners of the piece of stock, as said piece of stock rotates. Said Vibrations typically transmits throughout the machine and appear at the contact points of said Lathe with an underlying floor support. Now, if Actuator(s) are placed between the Lathe and underlying floor support, and said Actuator(s) are caused to operate so as to apply appropriate, (as regards Magnitude and Phase) Displacements, it occurs that Vibrations in the Lathe can be effectively reduced. Reduction of said Vibrations can serve to prolong the life of said Lathe, make an Operators job easier and perhaps even allow a superior processing of a piece of stock placed therein.

The present invention provides that Electrical Signals of various Frequencies exiting Band Pass Filters thereof each be, if necessary, subjected to appropriate independent Magnitude and Phase adjustments, (see Detailed Description Section for description of automated Magnitude and Phase Control), with the resulting adjusted electrical signals being summed and applied to one or more Actuator(s), which Actuator(s) in turn serve to apply proper Magnitude Corrective Action in a proper phase relationship with Sensor sensed Vibrations, to reduce said Vibrations, at a location physically removed from the point at which said vibrations are sensed by said intervening Actuator(s). The ability to perform this "Real-Time" Fast Fourier Transform-like Signal Decomposition process, (without the Constraints of Harmonic Frequency Determination), and provide continuous signals which individually correspond to Frequency Components of a signal, provides a user great control over the magnitude of, and when to apply opposing Actuator created Corrections to compensate Vibrations sensed by a Sensor. For instance, a higher frequency might be more attenuated by a system including the present invention than, a lower frequency. If that is the case, then higher frequencies can be subjected to greater amplification. A similar scenario exists with respect to Phase Shifts. It is noted that variable All-Pass Filters serve to provide Phase delay adjustment and that at its Central Frequency a Band Pass Filter causes essentially no Phase Shift in a signal.

It is to be understood that the processing of Signals exiting from various Band Pass Filters in various Bank Components in a present invention System can be subjected to Magnitude and Phase control by use of Look-Up Table techniques, or by fully automated techniques. In the case where a "Look-Up" Table is utilized, a user must investigate a physical system to determine its Frequency Content characteristics, then construct a Table which guides what is to be done to a Signal of a specific Frequency when it presents with a specific Magnitude and/or Phase. A Computer or Micro-Processor based system can be utilized to access a constructed "Look-Up" Table stored in Random Access (RAM) Memory, then serve to mediate the appropriate application of said stored "Look-Up" Table Data in use. Such an approach typically utilizes interpolation between stored Table Data points, and is well suited for use in Feed-Forward (ie. Open Loop), and Feed-Back (ie. Closed-Loop), Control Systems in which only a single Vibration Sensor is present. That is, in Systems in which a Single Vibration Sensor is utilized to monitor Vibrations per se., (eg. Feed-Forward Control Systems), and in Systems in which a single Sensor is utilized to monitor combined Vibrations and Actuator imposed compensating actions thereto, (Feed-Back Control Systems), a Look-Up Table approach to providing Compensation Signals is appropriate. A preferable approach, however, is to fully automate the present invention such that Electric Signals provided by two (2) Sensors, (a First Sensor which monitors "Feed-Forward/Open-Loop Control" Vibrations per se., and a Second Sensor which simultaneously monitors "Feed-Back/Closed-Loop" combined Vibrations and Actuator imposed compensation), are broken down into various Frequency Components as described above, then operate, in "Real-Time", on each of said Frequency Components to provide appropriate Magnitude and Phase corrections to the Signal from the Vibration per se. Monitoring Sensor, such that a Signal is developed which when applied to one or more Actuator(s) serves to compensate the Sensed Vibration Signal per se.

The present invention can then be viewed as a system for Decomposing an original signal of arbitrary frequency content into a user determined plurality of signals, each of which signals is centered about a variable center frequency. Said system comprising a Bank of a plurality of combination Phase Lock Loop and associated Band Pass Filter Bank Components, the Center Frequency of a Frequency Pass Band of each of said Band Pass Filters being effected by use of a signal input thereto, and output by an associated Phase Lock Loop, each of which Phase Lock Loops is set to provide user desired Capture and Lock-In Frequency Ranges. In use each of said combination Phase Lock Loop and associated Band Pass Filter Bank Components is provided the original signal at inputs thereof, such that in use a well defined Phase Lock Loop output signal is caused to be provided by a Phase Lock Loop and utilized by an associated Band Pass Filter to set a Passband Center Frequency thereof, if said original signal presents with a Frequency Component within the Capture and Lock-In Ranges of said associated Phase Lock Loop. Each said Band Pass Filter Center Frequency, once set, being, in use, continuously caused to vary if, and when, the Frequency Component in said original signal which effects a well defined output signal from an associated Phase Lock Loop, which output is input to an associated Band Pass Filter, and which Frequency Component of said original signal which said Associated Band Pass Filter is passing, varies within its associated Phase Lock Loop's Lock-In Range.

It is to be noted that said original signal can be an electric signal which monitors vibrations in a physical system, said physical system comprising an intervening actuator which is situated therein such that appropriate activation thereof can serve to compensate said sensed vibrations at a location offset from a source of said vibrations by said intervening Actuator. Each of which plurality of signals from each of which plurality of Band Pass Filters, is caused to be Magnitude and Phase adjusted as directed by a user, then summed and applied to said Actuator, with the effect being that vibrations present at said source of vibrations are essentially compensated at said location offset therefrom by said intervening Actuator.

The original signal can be provided by a sensor located so as to sense Open-Loop vibration, (ie. Feed-Forward signal), vibrations at the source thereof, or to sense Closed-Loop, (ie. Feed-Back signal), vibration at the location offset from said source of vibrations by said intervening Actuator.

The Magnitude and Phase of each of which plurality of signals can be adjusted by reference to a "Look-up" table which provides Magnitude and Phase modification specifications when provided with a signal frequency and phase.

As well, the original signal can be provided by a sensor which monitors an Open-Loop source of vibrations, the Magnitude and Phase of each of which plurality of signals are adjusted based upon a feedback signal provided by a sensor which monitors compensated Closed-Loop vibrations at a location offset from said source of vibrations by said Actuator, which feed-back signal enables automated determination of appropriate Magnitude and Phase modifications for application to each of said plurality of signals in real time.

It is to be noted that the present Invention can utilize more than one Sensor at a location in a physical system to provide electrical signals, and that one or more Actuators can be used at one or more locations to effect vibration compensating displacement application. For instance, one Sensor can feed to one or more PLL's, while another Sensor feeds to other PLL's in a present invention system, and, for instance, a signal from one Phase Lock Loop-Band Pass Filter combination can be fed to an Actuator, or two such signals of different frequencies can be fed to a Summer, and its output fed to an Actuator, etc. That is, generally, where a Sensor or Actuator is identified, such can be more than one component.

Continuing, an automated vibration compensating system of the present invention can be viewed as a system which decomposes an original electric signal of arbitrary frequency content into a user determined plurality of electric signals, each of which plurality of electric signals is centered about a variable center frequency. Said system comprises a Bank of a plurality of combination Phase Lock Loop and associated First Band Pass Filter Bank Components, the Center Frequency of a Frequency Pass Band of each of said First Band Pass Filters being effected by use of a signal input thereto, and output by, an associated Phase Lock Loop, each of which Phase Lock Loops is set to provide user desired Capture and Lock-In Frequency Ranges. In use each of said combination Phase Lock Loop and associated First Band Pass Filter Bank Components is provided the original electric signal at inputs thereof from Feed-Forward Open-Loop monitoring First Vibration Sensors, such that in use a well defined Phase Lock Loop output electric signal is caused to be provided by a Phase Lock Loop and utilized by an associated First Band Pass Filter to set a Passband Center Frequency thereof, and enable utilized Band Pass Filter output therefrom, if said original electric signal presents with a Frequency Component within the Capture and Lock-In Ranges of said associated Phase Lock Loop, and said Phase Lock Loop is locked thereonto. (Note, it is possible that some output may exit a Band Pass Filter when the Phase Lock Loop is not latched. This output, however, is not "utilized". That is, its effect is disabled by use of a Locking Signal from the Phase Lock Loop, which Locking Signal indicates a Non-Locked situation exists). Continuing, each said First Band Pass Filter Center Frequency, once set, is, in use, continuously caused to vary if, and when, the Frequency Component in said original electric signal which effects a well defined output signal from an associated Phase Lock Loop, which output is input to an associated First Band Pass Filter, and which Frequency Component of said original signal which said Associated First Band Pass Filter is passing, varies within its associated Phase Lock Loop's Lock-In Range, said original electric signal being provided by said First Vibration Sensor which monitors Feed-Forward/Open-Loop Loop vibrations at a source thereof in a Vibrating System. Each of which Phase Lock Loop and Associated First Band Pass Filter Bank Components further comprises a Associated Second Band Pass Filter, which Associated Second Band Pass Filter in each Bank Component is simultaneously provided Frequency Passband Center Frequency effecting electric signal input thereto, and output by, the same associated Phase Lock Loop which provides Center Frequency effecting electric single to said Associated First Band Pass Filter in said Bank Component, such that the Center Frequency of said Associated Second Band Pass Filter is set, and caused to vary in a manner the same as that of said Associated First Band Pass Filter. The Associated Second Band Pass Filter is caused to receive an input electric signal from a Second Vibration Sensor which monitors Feed-Back/Closed-Loop vibrations at a location physically offset from the location at which said Feed-Forward/Open-Loop vibration monitoring First Vibration Sensor is located, by said intervening Actuator, and said Second Vibration Sensor provides an output electric signal of a Frequency within the Frequency Pass Band of said Associated Second Band Pass Filter. In use signals are developed by appropriate Magnitude and Phase modifications to the signal from said associated First Band Pass Filter in each Bank Component, said Magnitude and Phase modifications in each Bank Component being based upon the signal exiting the Second Associated Band Pass Filter in each Bank Component, with said Magnitude and Phase adjusted signals from various Bank Components being summed and provided to said Actuator such that it is caused to respond with a physical action response which compensates said vibration sensed by said First Vibration Sensor, such that said Second Vibration Sensor is caused to sense a reduced Magnitude Compensated Vibration.

To expand, said signal provided to said Actuator which is produced by summing signals produced by Bank Components present, can be arrived at by first causing the electric signal which exits said Associated Second Band Pass Filter in each Bank Component to be Matched in Phase with the electric signal exiting said Associated First Band Pass Filter at a Bank Component specific Time Phase Instants (I2), then by causing, in each Bank Component, Gain to be imposed upon said resulting electric signal which exits said Associated First band Pass Filter, said Gain affected resulting electric signal being applied to said Actuator via a one-hundred-eighty (180) degree phase shift and Summation circuit simultaneous with other such electric signals developed in other present Bank Components. The result being that said electric signals exiting each of said Associated Second Band Pass Filters in each Bank Component are caused to shift in phase. This is followed by the application of Phase Shift to the electric signals exiting the First associated Band Pass Filter, in combination with increased imposed Gain, in each Bank Component, to again place the electric signals exiting both the First and Associated Second Band Pass Filters in each Bank Component into phase with one another at Bank Component specific Time Phase Instants (I3), followed by continued feed-back effected Gain adjustment of the electric signal exiting said Associated First Band Pass Filter in each Bank Component. The end result being that the electric signal resulting from Summation of electric signals from each present Bank Component which is caused to be applied to said Actuator is such that the action to be developed by said Actuator, is continuously simultaneously of essentially equal Magnitude and one-hundred-eighty (180) degrees out of phase with vibrations present at the source thereof, which vibrations are sensed by said First Vibration Sensor, such that the Vibrations sensed by said Second Vibration Sensor are of reduced compensated Magnitude as compared to the Magnitude of Vibrations sensed by said First Vibration Sensor.

A modified version of the described System allows for an integrated simultaneous Gain and Phase Control without the requirement that Phase Shifts be separately implemented at specific time instants. That is, after Time Instant (I2), a Phase Time Condition at the input to system components (eg. Up/Down Counters), approach to describing the circuit operation is appropriate. This can be described as a system in which said signal provided to said Actuator which is produced by summing signals produced by Bank Components present, is arrived at by first causing the electric signal which exits said Second Associated Band Pass Filter in each Bank Component to be Matched in Phase with the electric signal exiting said Associated First Band Pass Filter at a Bank Component specific Time Phase Instants (I2). Next, in each Bank Component, Gain is caused to be imposed upon said electric signal being applied to said Actuator via said Summation circuit simultaneous with other such electric signals developed in other present Bank Components, with the result being that said electric signals exiting each said Associated Second Band Pass Filter in each Bank Component are caused to shift in phase. This is followed by the continuous application of varying Gain to the signal applied to the Actuator after summation with similarly processed signals from each Bank Component, said Gain being determined by a phase difference in signals from the output of associated Second Band Pass Filters and said Phase Lock Loops in each Bank Component, and simultaneous continuous Phase Shift to the electric signals exiting the First associated Band Pass Filter in each Bank Component, to again place the electric signals exiting both the First and Associated Second Band Pass Filters in each Bank Component into phase with one another. The end result being that the electric signal resulting from Summation of electric signals from each present Bank Component which is caused to be applied to said Actuator is such that the action developed by said Actuator, is continuously simultaneously of essentially equal Magnitude and one-hundred-eighty (180) degrees out of phase with vibrations present at the source thereof, which vibrations are sensed by said First Vibration Sensor, such that the Vibrations sensed by said Second Vibration Sensor are of reduced compensated Magnitude as compared to the Magnitude of Vibrations sensed by said First Vibration Sensor.

(Note, as the Magnitude and Phase control aspects of the present inventional are fairly involved, further discussion thereof is undertaken herein only with reference to various included Drawings, (see Detailed Description Section of this Disclosure).

The present invention also comprises Methods of decomposing an original signal into a user determined plurality of signals, each of which signals is centered about a variable center frequency. Such a Method can be described as:

Step a. Obtaining a system for decomposing an original signal of arbitrary frequency content into a user determined plurality of signals, each of which plurality of signals is centered about a variable center frequency, said system comprising a Bank of a plurality of combination Phase Lock Loop and associated Band Pass Filter Bank Components, the Center Frequency of a Frequency Pass Band of each of said Band Pass Filters being effected by use of a signal input thereto, and output by, an associated Phase Lock Loop, each of which Phase Lock Loops is set to provide user desired Capture and Lock-In Frequency Ranges. In use each of said combination Phase Lock Loop and associated Band Pass Filter Bank Components is provided the original signal at inputs of said phase lock loop and band pass filter thereof, such that a well defined Phase Lock Loop output signal is caused to be provided by a Phase Lock Loop and utilized by an associated Band Pass Filter to set a Passband Center Frequency thereof, and enable utilized Band Pass Filter output therefrom, if said original signal presents with a Frequency Component within the Capture and Lock-In Ranges of said associated Phase Lock Loop, and said Phase Lock Loop is locked thereonto. Each said Band Pass Filter Center Frequency, once set, being, in use, continuously caused to vary if, and when, the Frequency Component in said original signal which effects a well defined output signal from an associated Phase Lock Loop, which output is input to an associated Band Pass Filter, and which Frequency Component of said original signal which said Associated Band Pass Filter is passing, varies within its associated Phase Lock Loop's Lock-In Range.

Step b. Setting the Capture and Lock-In Frequency Ranges of each Phase Lock Loop present.

Step c. Applying an arbitrary frequency content original signal to inputs of the Phase Lock Loops and Band Pass Filters of said system for decomposing an original signal of arbitrary frequency content.

Step d. Monitoring the output signals from at least some of said plurality of Band Pass Filters.

Said Method can involve accessing an electric signal provided by a Sensor which monitors vibrations in a physical system, said physical system comprising an intervening actuator which is situated therein such that appropriate activation thereof can serve to compensate said sensed vibrations at a location offset from a source of said vibrations by said intervening Actuator, each of which plurality of signals from each of which plurality of Band Pass Filters, is caused to be Magnitude and Phase adjusted as directed by a user, then summed and applied to said Actuator, with the effect being that vibrations present at said source of vibrations are essentially compensated at said location offset therefrom by said intervening Actuator. Said Method can require that the sensor be located so as to sense Open-Loop vibrations at the source thereof or so as to sense Closed-Loop vibrations at the location offset from said source of vibrations by said intervening Actuator. The Method can involve reference to a "Look-up" table which provides Magnitude and Phase modification specifications when provided with a signal frequency and phase, or involve use of a feed-back Signal in which case the original signal is provided by a sensor which monitors an Open-Loop source of vibration, and the method further comprises the step of modifying the Magnitude and Phase of each of which plurality of signals based upon a feed-back signal provided by a sensor which monitors compensated Closed-Loop Vibration at a location offset from said source of vibration by said Actuator, which feed-back signal enables automated determination of appropriate Magnitude and Phase modifications for application to each of said plurality of signals in real time.

When a Feed-Back Loop Sensor is present a method of compensating vibrations in a vibrating system can comprise the steps of:

Step a. Providing a Vibration Compensating system to a Vibrating System, which Vibration Compensating System decomposes an original electric signal of arbitrary frequency content into a user determined plurality of electric signals, each of which plurality of electric signals is centered about a Variable Center Frequency. Said Vibration Compensating system comprising a Bank of a plurality of combination phase lock loop and associated First Band Pass Filter Bank Components, the Center Frequency of a frequency pass band of each of said Associated First Band Pass Filters being effected by use of a signal input thereto, and output by, an associated Phase Lock Loop, each of which Phase Lock Loops is set to provide user desired Capture and Lock-In frequency ranges. In use each of said combination Phase Lock Loop and Associated First Band Pass Filter Bank Components is provided the original electric signal at inputs thereof from a First Vibration Sensor, which First Vibration Sensor monitors vibrating system Feed-Forward/Open-Loop vibrations, and such that in use a well defined Phase Lock Loop output electric signal is caused to be provided by a Phase Lock Loop and utilized by said Associated First Band Pass Filter to set a passband Center Frequency thereof, and enable utilized Band Pass Filter output therefrom, if said original electric signal presents with a frequency component within the Capture and Lock-In range of said Associated Phase Lock Loop and said Phase Lock Loop is locked thereonto. Each said First Band Pass Filter Center Frequency, once set, being, in use, continuously caused to vary if, and when, the frequency component in said original electric signal which effects a well defined output signal from an associated Phase Lock Loop, which output is input to an associated First Band Pass Filter, and which frequency component of said original signal which said associated First Band Pass Filter is passing, varies within its associated Phase Lock Loop's lock-in range. Each of which Phase Lock Loop and Associated First Band Pass Filter Bank Components further comprises a Associated Second Band Pass Filter, which Second Associated Band Pass Filter in each Bank Component is simultaneously provided frequency passband Center Frequency effecting electric signal input thereto, and output by, the same Associated Phase Lock Loop which provides Center Frequency effecting electric single to said Associated First Band Pass Filter in said Bank Component, such that a Center Frequency of said Associated Second Band Pass filter is set, and caused to vary in a manner the same as that of said Associated First Band Pass Filter. The Associated Second Band Pass Filter is caused to receive an input electric signal from a Second Vibration Sensor in said vibrating system, which Second Vibration Sensor monitors Feed-Back/Closed-Loop Vibrations at a location physically offset from the location at which said Feed-Forward/Open-Loop Vibration monitoring First Vibration Sensor is located by an intervening Actuator, and which Second Vibration Sensor provides an output electric signal of a frequency within the frequency pass band of said Associated Second Band Pass Filter; such that in use signals are developed by appropriate Magnitude and Phase modifications to the signal from said Associated First Band Pass Filter in each Bank Component, which Magnitude and Phase modifications are based upon the signal exiting said Associated Second Band Pass Filter in each Bank Component, with said Magnitude and Phase adjusted signals from various Bank Components being summed and provided to said Actuator such that it is caused to respond with a physical action response which compensates said vibration sensed by said first vibration sensor such that said second vibration sensor is caused to sense a reduced magnitude compensated vibration.

Step b. Setting the Capture and Lock-In ranges of each present Phase Lock Loop.

Step c. Causing signals to be input to said Phase Lock Loops and First Band Pass Filters from said First Vibration Sensor which monitors Feed-Forward/Open-Loop vibrating system vibrations, and causing signals from said Second Vibration Sensor, which monitors Feed-Back/Closed-Loop vibrations in said vibrating system, to be input to said Associated Second Band Pass Filters.

The present invention will be better understood, particularly in the context of application to automated Vibration Compensation in physical systems, by reference to the Detailed Description Section herein, with appropriate reference to the accompanying Drawings.

SUMMARY OF THE INVENTION

It is therefore a primary purpose of the present invention to provide a system for decomposing an original signal of arbitrary frequency content into a user determined plurality of signals, each of which signals is centered about a variable center frequency.

It is another purpose of the present invention to teach the use of a Bank of a plurality of combination Phase Lock Loop and associated Band Pass Filter Bank Components, the Center Frequency of a Frequency Pass Band of each of said Band Pass Filters being effected by use of a signal input thereto, and output by, an associated Phase Lock Loop.

It is yet another purpose of the present invention to provide a system for compensating vibrations in a physical system as sensed by sensors located therein to sense Open-Loop, (ie. Feed-Forward Signal) and/or Closed-Loop, (ie. Feed-Back Signal), vibration signals.

It is yet another purpose of the present invention to provide a system for compensating vibrations in a physical system in which the Magnitude and Phase of each of a plurality of signals are modified by reference to a "Look-up" table which provides Magnitude and Phase modification specifications when provides with a signal frequency and phase.

It is still yet another purpose of the present invention to provide automated systems for compensating vibrations in a physical system in which the Magnitude and Phase of each of which plurality of signals are modified based upon feed-back provided by a sensor which monitors compensated Closed-Loop vibrations.

It is yet still another purpose of the present invention to teach specific circuitry systems and methods of application thereof for accomplishing the above purposes.

BRIEF DESCRIPTION OF THE DRAWINGS

FIGS. 3aS1, 3aS2, 3aS3 and 3bS6 show signal diagrams for appropriate locations in FIG. 3a.

FIGS. 3bS1, 3bS2, 3bS3, 3bS5 and 3bS6 show signal diagrams for appropriate locations in FIG. 3b.

FIGS. 4S1, 4S2, 4S3, 4S5 and 4S6 show signal diagrams for appropriate locations in FIG. 4.

FIG. 5 show an embodiment of a phase matching circuit utilized in present invention realization efforts to date.

FIGS. 5S1-5S4 show signal diagrams for appropriate locations in FIG. 5.

FIG. 6 show another embodiment of a phase matching circuit utilized in present invention realization efforts to date.

FIGS. 6S1-6S4 show signal diagrams for appropriate locations in FIG. 6.

FIGS. 7S1 and 7S2 show signal diagrams for appropriate locations in FIG. 7.

FIGS. 8S0–8S7 and 8S7' show signal diagrams for appropriate locations in FIG. 8.

FIGS. 9a0–9a12 and 9b1–9b2 show signal diagrams for appropriate locations in FIG. 9.

FIGS. 10aC0–10aC6 show relevant signal diagrams for appropriate locations in FIG. 10a.

FIGS. 10b and 10c show Phase Time Conditions relevant to the discussion of the schematic diagram of FIG. 10a.

FIG. 10d shows a time based Signal Diagram relevant to the discussion of the schematic diagram of FIG. 10a.

DETAILED DESCRIPTION

Figure 1A:
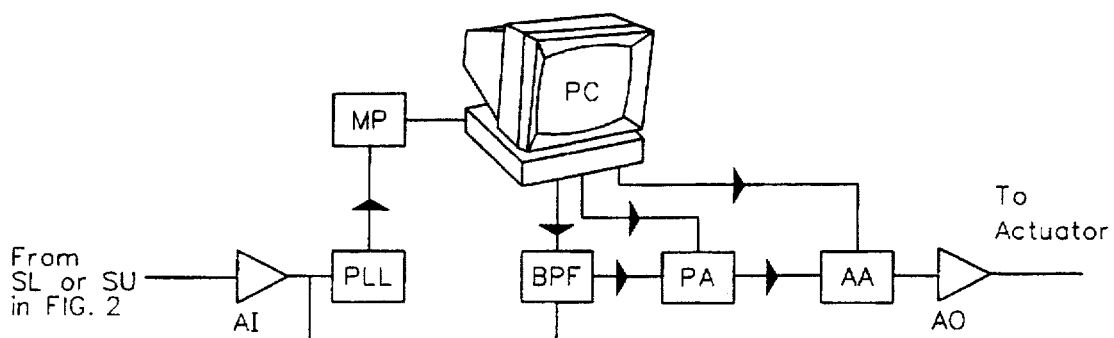
FIG. 1a shows a diagram of a feed-forward or feed-back embodiment of a present invention system for decomposing an arbitrary frequency content signal into a plurality or multiplicity of signals centered at user determined center frequencies.
Figure 1B:
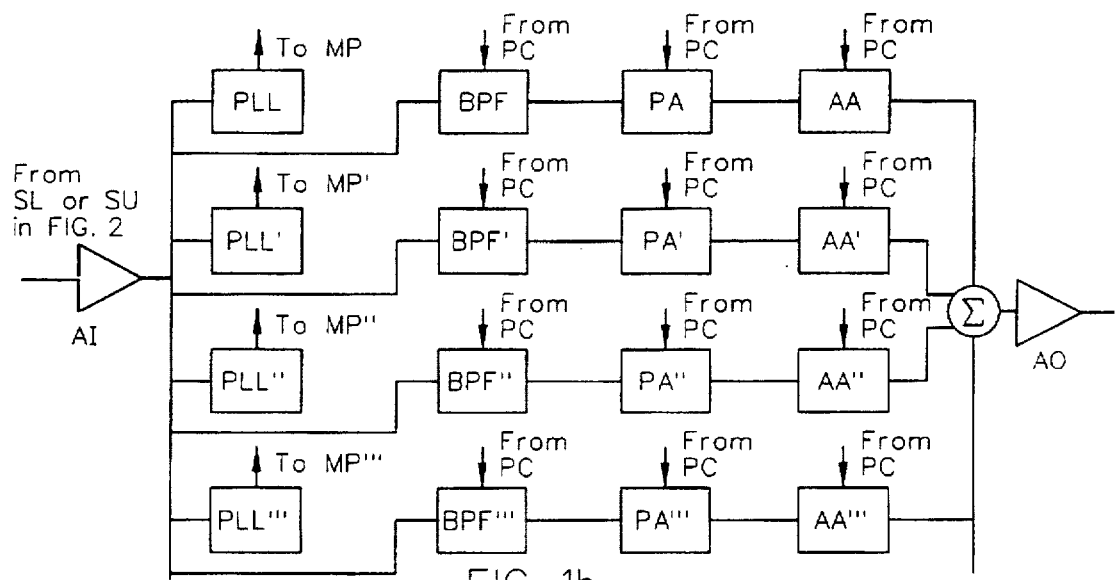
FIG. 1b shows a present invention Bank of Phase Lock Loop and Band Pass Filter combination Components for use in decomposing a signal of arbitrary frequency content into a plurality or multiplicity of signals centered at user determined center frequencies.
Figure 2:
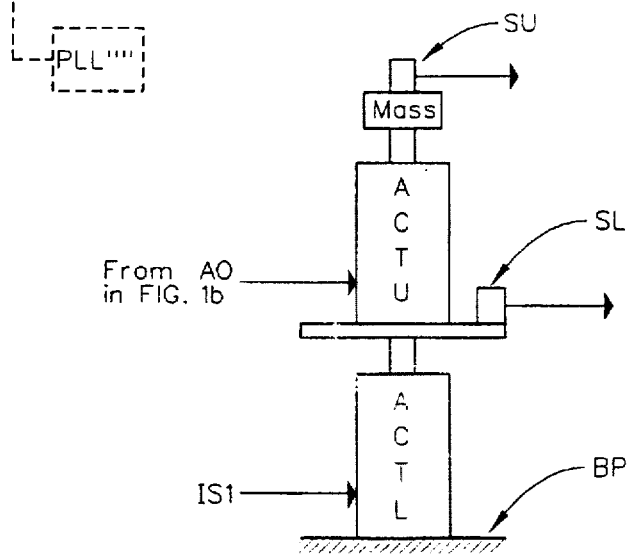
FIG. 2 shows a vibration source and actuator compensation system.

Turning now to the Drawings, there is shown in FIGS. 1a, 1b and 2 a demonstrative system of the present invention. FIG. 2 shows a representation of a physical system which includes a source of vibrations, depicted as Lower Actuator (ACTL), which Lower Actuator (ACTL) rests upon an essentially fixed position Baseplate (BP). In use a series of Input Signal (IS1) induced vibrations are caused to appear at a location atop said Lower Actuator (ACTL), at which position is present a Lower Sensor (SL), which Lower Sensor (SL) serves to provide an electric signal representation of said effected vibrations. Simultaneously, an Upper Sensor (SU), present atop an Upper Actuator (ACTU), also senses said vibrations and provides an electric signal representation thereof. In use, said Upper Actuator (ACTU), which is shown situated atop said Lower Actuator (ACTL) in FIG. 2, is provided an input signal, (demonstrated in FIG. 2 as coming from the FIGS. 1a or 1b Output Amplifier (AO)), by the system of the present invention. Said input signal causes said Upper Actuator (ACTU) to respond in a manner such that the vibrations caused by said Lower Actuator (ACTL), in response to the (IS1) Signal input thereto, are essentially compensated at the location of the (Mass) shown atop said Upper Actuator (ACTU). That is, because of a combined displacement action of the Lower (ACTL) and Upper (ACTU) Actuators, an electric signal provided by Upper Sensor (SU), in response to the Signal (IS1) input to the Lower Actuator (ACTL), is caused to be of a lesser Magnitude than that provided by Lower Sensor (SL), with said electric signal from said Upper Sensor (SU) being, ideally, zero.

FIG. 1a shows that an electric signal from said Lower Sensor (SL) or from said Upper Sensor (SU) shown in FIG. 2, can be fed to a present invention system Input Amplifier (AI). In the case where said electric signal is provided from the Lower Sensor (SL) the resulting system is appropriately termed a "Feed-Forward Control", (ie. an "Open-Loop Configuration)", and in the case where said electric signal is fed from the Upper Sensor (SU), the resulting system is appropriately termed a "Feed-Back Control", (ie. a "Closed-Loop Configuration"). An electric signal, after amplification by Input Amplifier (AI) is shown to be applied to a Phase Lock Loop (PLL), the output of which Phase Lock Loop (PLL) is fed, via a Signal Period Measurement Circuit (MP), to a Personal Computer or Microprocessor System, (identified as (PC)). To enable the present invention, said (PC) is caused to have in its memory a "Look-Up" Table, and based upon the Period of the Signal fed thereto, said "Look-Up" Table provides Magnitude and Phase adjustment control signals to Phase Adjustment (PA) and Magnitude Adjustment (AA) Circuitry Systems, which Phase Adjustment (PA) and Magnitude Adjustment (AA) Circuitry Systems then serve to modify an electric signal passing therethrough, said electric signal being a Band Pass Filtered version of the electric signal provided from Lower Sensor (SL) or Upper Sensor (SU) via Input Amplifier (AI). It is to be understood that signal from said (PC) effects a Center Frequency of the Band Pass Filter (BPF). (Note, alternatively, an output signal from a Phase Lock Loop can be utilized directly to effect a Band Pass Filter Center Frequency as discussed with respect to FIGS. 8, 9 and 10a supra). It is also to be understood that Phase Lock Loops provide a "Locked-Onto" Signal which serves to indicate that a Frequency Component in a signal input thereto is "Locked-Onto" in use. The present invention makes use of said "Locked-Onto" Signal to enable utilization of output from an associated Band Pass Filter. That is, if the "Locked-Onto" Signal is not present, the output from the Phase Lock Loop is not well defined, and the output from an associated Band Pass Filter is not utilized. The "Non-Utilization" can be effected anywhere in a circuit between a Sensor and Actuator by means not shown.

FIG. 1b shows that the Phase Lock Loop (PLL), Band Pass Filter (BPF), Phase Adjust (PA) and Magnitude Adjust (AA) Circuitry shown in FIG. 1a actually comprise a Bank of said present invention components, said Bank Components being demonstrated by Prime "'", Double Prime "''" and Triple Prime "'''" identifiers. It is to be understood that any number of Bank Components can be present, (as indicated by the dotted (PLL"") and it is to be understood that FIG. 1b is demonstrative of a major aspect of the present invention. Each Phase Lock Loop (eg. (PLL), (PLL'), (PLL") and (PLL''') is user set to have Capture and Lock-In Frequency Ranges which typically differ from the other present Bank Components. That is, the present invention utilizes a Bank of Phase Lock Loop containing Components to, in real time, "Decompose" an electric signal entered thereto into a Plurality or Multiplicity of Frequency Components. Each said Frequency Component in the electric signal is sequestered by a Band Pass Filter, the Center Frequency of which is set by reference to the output of its associated detecting Phase Lock Loop. Each sequestered electric signal Frequency Component is then acted upon independently, as described infra, such that Phase and Magnitude Adjustments are effected thereupon, with the results of all Frequency Components then being summed prior to being entered to said Output Amplifier (AO).

An important point is that as it is Phase Lock Loops which effect the electric signal Frequency Decomposition, a Frequency Component detected by a Phase Lock Loop within its user set Capture Range, will be followed by said Phase Lock Loop within the extent of its Lock-In Range. Thus, an electric signal Frequency Component detected by a Phase Lock Loop can "Float", (ie. vary), a bit in use, and the output from said Phase Lock Loop which detects said Frequency Component will follow said variation, with the output therefrom being used directly, or via a Period Measuring (MP) Circuit, by said (PC), to effect a change in an associated Band Pass Filter Center Frequency.

The above description of the present invention is focused upon embodiments which utilize a single input electric signal and require the use of "Look-Up" tables stored in a PC, Microprocessor, or the like, "Memory" to determine what Magnitude and Phase modifications should be applied to sensed signals prior to application thereof to an Upper Actuator (ACTU). It is also noted that in the case of the Feed-Back Control embodiment it is essentially impossible to separate Lower (ACTL) and Upper (ACTU) Actuator effected contributions to electric signals provided by an Upper Sensor (SU).

A preferable approach to Vibration Compensation utilizes signals from two (2) sensors, (ie. Upper (SU) and Lower (SL) sensors), simultaneously, and effects real-time automated vibration compensation base upon comparison thereof.

Following is a presentation of automated feed-back systems which simultaneously utilize signals provided by both Upper (SU) and Lower (EL) Sensors to the end that, in present Decomposed Frequency Bands, the Magnitude of a signal exiting the Upper Sensor (SU) is compensated (ie. reduced), ideally to zero (0.0), in the presence of continued signal output from a Lower Sensor (SL). It will be appreciated that separate automated feed-back systems disclosed directly can be individually applied to signals in Frequency Bands which are derived as described infra by use of a signal Frequency Decomposing Bank of Phase Lock Loops and Band Pass Filter combinations. That is, signals from Upper (SU) and Lower (SL) Sensors can be Decomposed into a plurality or multiplicity of Frequency bands, followed by application of automated Feed-Back Circuitry compensation of signals in each Frequency Band independently, with the results thereof then being summed and applied as a single signal to an Upper Actuator (ACTU).

Figure 3A:
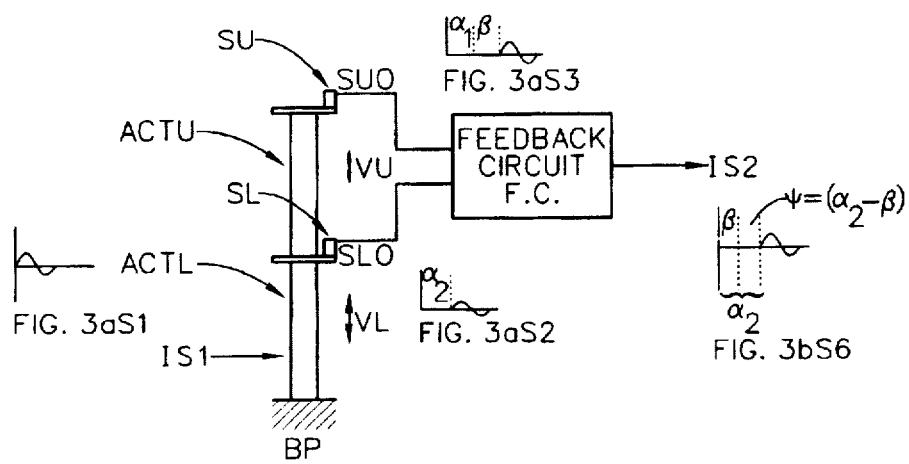
FIG. 3a shows a vibration source and actuator compensation system and an accompanying feed-back circuit.

Turning now to FIG. 3a, there is shown a demonstrative Double Actuator driving system in combination with a block diagram indication of a present invention vibration control Feed-Back Circuitry (FC) system. (Circuitry Blocks constituting various embodiments of the Feed-Back Circuitry (FC) will be described supra herein beginning with discussion of FIG. 5). A driving signal (IS1), shown in Signal Diagram FIG. 3aS1, is shown as input to a Lower Actuator (ACTL), which Lower Actuator (ACTL) is situated atop an assumed Base (BP), and in response signals (SUO) and (SLO), shown in Signal Diagram FIGS. 3aS3 and 3aS2 respectively, (as produced by the Upper (SU) and Lower (SL) sensors respectively), are effected. Said signals (SUO) and (SLO) being in response to vibrations occurring at the positions of said Upper (SU) and Lower (SL) sensors. (Note that said Upper (SU) and Lower (SL) Sensors effectively monitor Displacement via an Acceleration). It is to be noted that the signals (SUO) and (SLO) exiting Upper (SU) and Lower (SL) Sensors respectively are phase shifted by an amount indicated as Alpha1 ($\alpha$1) and Alpha2 ($\alpha$2) with respect to the phase of the Driving Signal (IS1) entered to the Lower Actuator (ACTL). Said Alpha1 ($\alpha$1) and Alpha2 ($\alpha$2) phase shifts are the result of the combined effects upon a signal entered to an Actuator, by the Actuator per se. and an associated Sensor. Note also that an additional phase shift labeled Beta ($\beta$) is shown in Signal Diagram FIG. 3aS3 signal (SUO) exiting the Upper Sensor (SU), with respect to the Signal Diagram FIG. 3aS2 Driving Signal (IS1) which is input to the Lower Actuator (ACTL). This additional phase shift can result from, for instance, tolerance in fabrication of an Actuator, the presence of phase shift introducing cable, or perhaps the presence of non-rigid mounting means between the Lower Actuator (ACTL) source of vibrations, and the effective location of the Upper Sensor (SU). It is to be understood that Signals (SUO) and (SLO) as shown in Signal Diagram FIGS. 3aS3 and 3aS2, from identified Upper (SU) and Lower (SL) Sensors respectively, result when no signal is input to the Upper Actuator (ACTU).

Figure 3B:
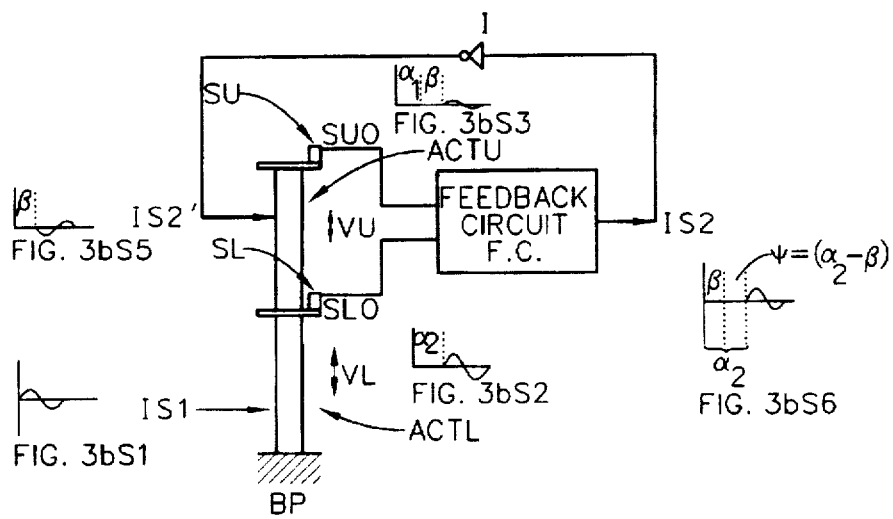
FIG. 3b shows the FIG. 3a vibration source and actuator compensation system, with the feed-back circuit providing a compensating feedback signal to the upper actuator.

FIG. 3bS6 shows a signal diagram of the signal (IS2) exiting the Feedback Circuit (FC).

Continuing, the purpose of the presently disclosed present invention Feed-Back Circuitry (FC) is to produce a signal which when input to the Upper Actuator (ACTU), causes the signal exiting said Upper Sensor (SU), to be reduced in magnitude, and ideally eliminated altogether, because Vibrations present at the location of said Upper Sensor (SU) are compensated by Action effected by said Upper Actuator (ACTU), in response to a signal input thereto. To achieve this result, the Action caused by the Upper Actuator (ACTU), must be of an Appropriate Magnitude and Phase such that the Upper Actuator (ACTU) Action is caused to be comparable in magnitude and one-hundred-eighty (180) degrees out of phase with a displacement caused by the signal (IS1) input to the Lower Actuator (ACTL). That is, the signal input to the Upper Actuator (ACTU) must be shifted in phase, with respect to the signal exiting the Upper Sensor (SU), to account for phase shift differences in signals exiting Upper Sensor (SU) and Lower Sensor (SL) identified infra. For simplicity, in the following it will be assumed that Alpha1 ($\alpha 1$) and Alpha2 ($\alpha 2$) are equal.

Turning now to FIG. 3b, there is shown an input signal (IS1), (see Signal Diagram FIG. 3bS1), input to a Lower Actuator (ACTL). It will be noted that an output signal (IS2), (see Signal Diagram FIG. 3bS6), from the Feed-Back Circuit (FC) is input to the Upper Actuator (ACTU), by way of a one-hundred-eighty (180) degree phase shift Inverter (I). At the input to said Upper Actuator (ACTU) the input signal, (see Signal Diagram FIG. 3bS5), is identified as (IS2') to indicate that it is an inverted form of the signal (IS2). The result of applying the signal (IS2') to the input of the Upper Actuator (ACTU) is best appreciated by comparing the Output Signal (SUO) from the Upper Sensor (SU) in FIG. 3a, with that in FIG. 3b, (ie. comparing signals in Signal Diagram FIGS. 3aS3 and 3bS3). It will be noted that Signal Diagram FIG. 3bS3 shows an Output Signal from the Upper Sensor (SU) which is, compared to the signal in Signal Diagram FIG. 3aS3, greatly reduced in magnitude. Achieving this effect, of course, is entirely dependent upon the capability of the Feed-Back Circuit (FC) to provide a signal (IS2') of appropriate phase and magnitude to the input of the Upper Actuator (ACTU), while a Driving Signal (IS1) being applied to the input of the Lower Actuator (ACTL). It should then be appreciated that the goal of the present invention automated Feed-Back Circuitry (FC), is to, in real time, essentially continuously provide an input signal (IS2') to said Upper Actuator (ACTU) which essentially completely compensates for vibrations present at the location of the Upper Sensor (SU), which vibrations are, in the context of FIGS. 3a and 3b, induced by the input of signal (IS1) to said Lower Actuator (ACTL).

Figure 4:
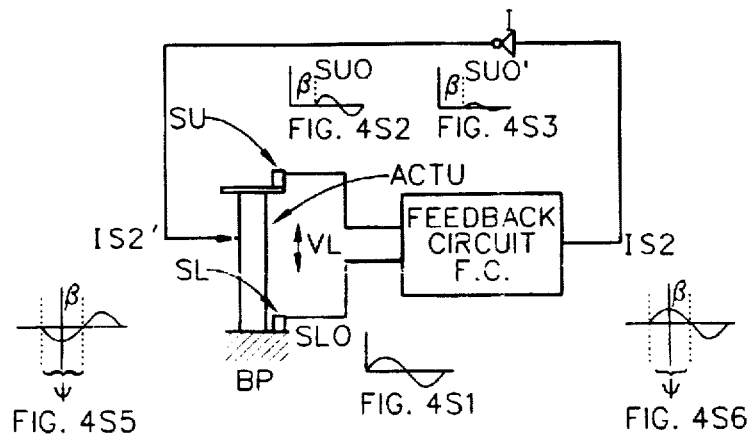
FIG. 4 shows a system with no mechanical actuator vibration source present.
Figure 5:
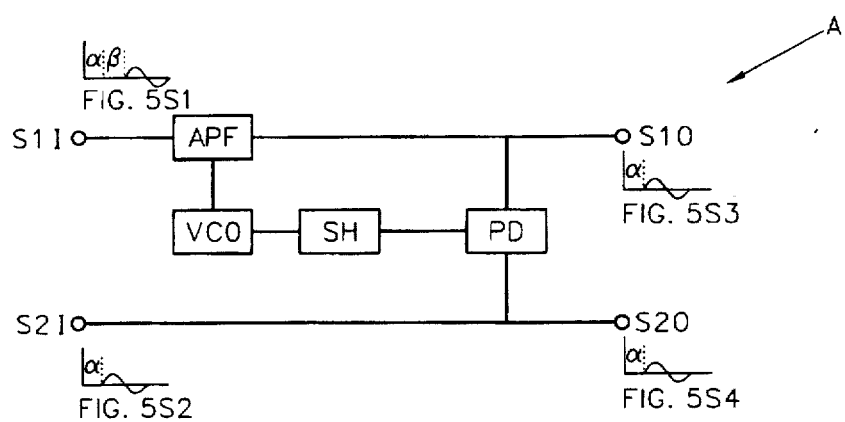
Figure 6:
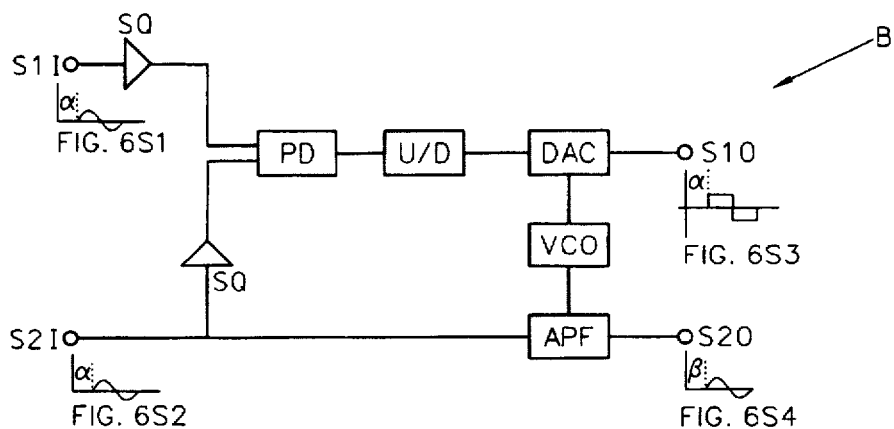

Turning now to FIG. 4, there is shown a more practical scenario in which one would typically find application of the present invention. In effect the Lower Actuator (ACTL) has been removed and the Lower Sensor (SL) is shown as placed upon a Base (BP) which, in the context of FIG. 4 is subject to externally generated vibrations. Signal Diagram FIG. 4S1 signal (SLO) is shown as being output from said Lower Sensor (SL) in response to vibrations present in said Base (BP). Signal Diagram FIGS. 4S2 and 4S3 show signals (SUO) and (SUO') exiting Upper Sensor (SU). Signal (SUO) is an uncompensated signal, and signal (SUO') is a compensated signal (SUO), said compensation being effected by application of the present invention Feed-Back Circuit (FC) Inverted Signal (IS2') at the input of the Upper Actuator (ACTU). The Signal in Signal Diagram FIG. 4S6 is representative of the output of the Feedback Circuitry (FC) and the signal in Signal Diagram FIG. 4S5 is an inverted version thereof input to the Upper Actuator (ACTU) via the one-hundred-eighty degree (180) phase shift inverter (I). It is noted that FIGS. 3a and 3b were presented first herein as a very definite applied signal (IS1) input to the Lower Actuator (ACTL), was available as a phase reference. Said availability facilitated discussion of the present invention Feed-Back Circuit (FC) operation. The phase shifts in signals (IS2), (IS2'), (SUO) & (SUO') shown in Signal Diagram FIGS. 4S6, 4S5, 4S2 and 4S3 respectively, however, are referenced to the Output Signal (SLO) from the Lower Sensor (SL). (Note that a phase shift PSI ($\Psi$) which is equal to Signal Diagram FIG. 3bS6 (Alpha2 ($\alpha 2$)—Beta ($\beta$)), is identified in Signal Diagram FIG. 4S6 (IS2) and Signal Diagram FIG. 4S5 (IS2') signals, but that PSI ($\Psi$) is difficult to interpret). It will then be appreciated that the Signal Diagram FIGS. 3bS6 and 3bS5 presentation regarding (IS2) and (IS2') signal phase shifts is easier to follow because of the presence of an applied signal, (the Signal Diagram FIGS. 3aS1 and 3bS1 signal (IS1) which is input to the FIGS. 3a and 3b Lower Actuator (ACTL)), to use as a reference. The reader is thus referenced to discussion of FIGS. 3a and 3b and associated Signal Diagram Figures to arrive at a more easily understood appreciation of the identified relative signal phase shifts, and control thereof, involved in the present invention operation. Generally throughout this Disclosure, the presence of a Lower Actuator (ACTL) will be assumed for the purpose of providing an Input Signal for use as a phase reference. It is stated, however, that the present invention Feed-Back Circuitry (FC), when simultaneously provided with signals from Lower (SL) and Upper (SU) Sensors, which signals result from vibrations occurring at a FIG. 4 Base (BP) for instance, acts to provide a signal which when input to an Upper Actuator (ACTU), causes said Upper Actuator to react by providing a corrective action which corresponds to a signal which is essentially of equal magnitude and one-hundred-eighty (180) degrees out of phase with a Feed-Back signal which would be originally present thereat, (prior to any magnitude and phase compensation thereof), such that the signal exiting the Upper Sensor (SU) becomes greatly reduced, in the presence of vibrations sensed by the Lower Sensor (SL). The end effect being that vibrations are compensated at the location of the Upper Sensor (SU) in the presence of continued vibrations at the location of the Lower Sensor (SL).

Turning now to a description of the Feed-Back Circuitry (FC) per se, which has been utilized in the presently reported work to date, there is shown in FIG. 5 a Circuit Block (A) which accepts two Input Signals (S1I) & (S2I), (see signal diagrams FIGS. 5S1 and 5S2 respectively), which Input Signals (S1I) & (S2I) are assumed to be out of phase with one another. (Note that Input Signals (S2I) & (S1I) in FIGS. 5S1 and 5S2 are essentially signals which would be obtained from Lower (SL) and Upper (SU) Sensors, respectively, in FIGS. 3a, 3b and 4). Said Circuit Block (A) reacts to put said Input Signals (S1I) and (S2I) into phase with one another in the form of Output Signals (S1O) & (S2O), (see FIGS. 5S3 and 5S4 respectively). Note, in Signal Diagram FIG. 5S1, that Input Signal (S1I) is offset from an arbitrary reference by a phase shift of Alpha+Beta ($\alpha+\beta$), while the Input Signal (S2I) in Signal Diagram FIG. 5S2 is offset from the same reference by only a phase shift Alpha ($\alpha$). The Output Signals (S1O) & (S2O), shown in Signal Diagram FIGS. 5S3 and 5S4 respectively, however, are each offset from the arbitrary reference by Alpha ($\alpha$) only. Circuit Block (A) operates by detecting a phase difference between Input Signals (S1I) and (S2I) by use of a Phase Detector (PD). Said Phase Detector operates to provide a Signal to a Sample and Hold Circuit (SH), which Sample and Hold (SH) Circuit enables an increasing ramping voltage to be applied to a Voltage Controlled Oscillator (VCO), which Voltage Controlled Oscillator (VCO) responds with an output which demonstrates an Increasing Frequency. Said Increasing Frequency signal is fed to an All Pass Filter (APF), which All Pass Filter (APF) responds by applying a phase shift to the Input Signal (S1I) input thereinto. When the Phase Detector (PD) detects that Output Signals (S1O) & (S2O), (see Signal Diagram FIGS. 5S3 and 5S4), are caused to be in-phase with one another by the phase shift entered to Input Signal (S1I) by said All Pass Filter (APF), it acts to cause the Sample and Hold (SH) circuit to stop the ramping of the voltage into the Voltage Controlled Oscillator (VCO), and hold it at a fixed level. Thereafter the All Pass Filter (APF) acts to provide a constant phase shift to the Input Signal (S1I), which at the time of operation of the Sample and Hold (SH) circuit, caused the Input Signals (S1I) and (S2I) to be phase matched. It is to be understood that the phase shift effecting All Pass Filter (APF) could be placed in the lower leg of the circuit shown in FIG. 5, such that the Input Signal (S2I) would be caused to experience a phase shift by operation of said Circuit Block A to the end that the Output Signals (S1O) & (S2O) would be in phase, but offset from a reference by Alpha+Beta ($\alpha+\beta$). (Note that in discussion of FIG. 8 supra, such a configuration is also described as one version of a "Circuit Block (B)"). It is noted that after the Sample and Hold (SH) circuit operates, that absent a Reset, (not shown), signal being executed, Input Signal (S2I) could continue to vary in phase, thereby again effecting an "Out-of-Phase" condition between Output Signals (S1O) and (S2O).

Figure 10A:
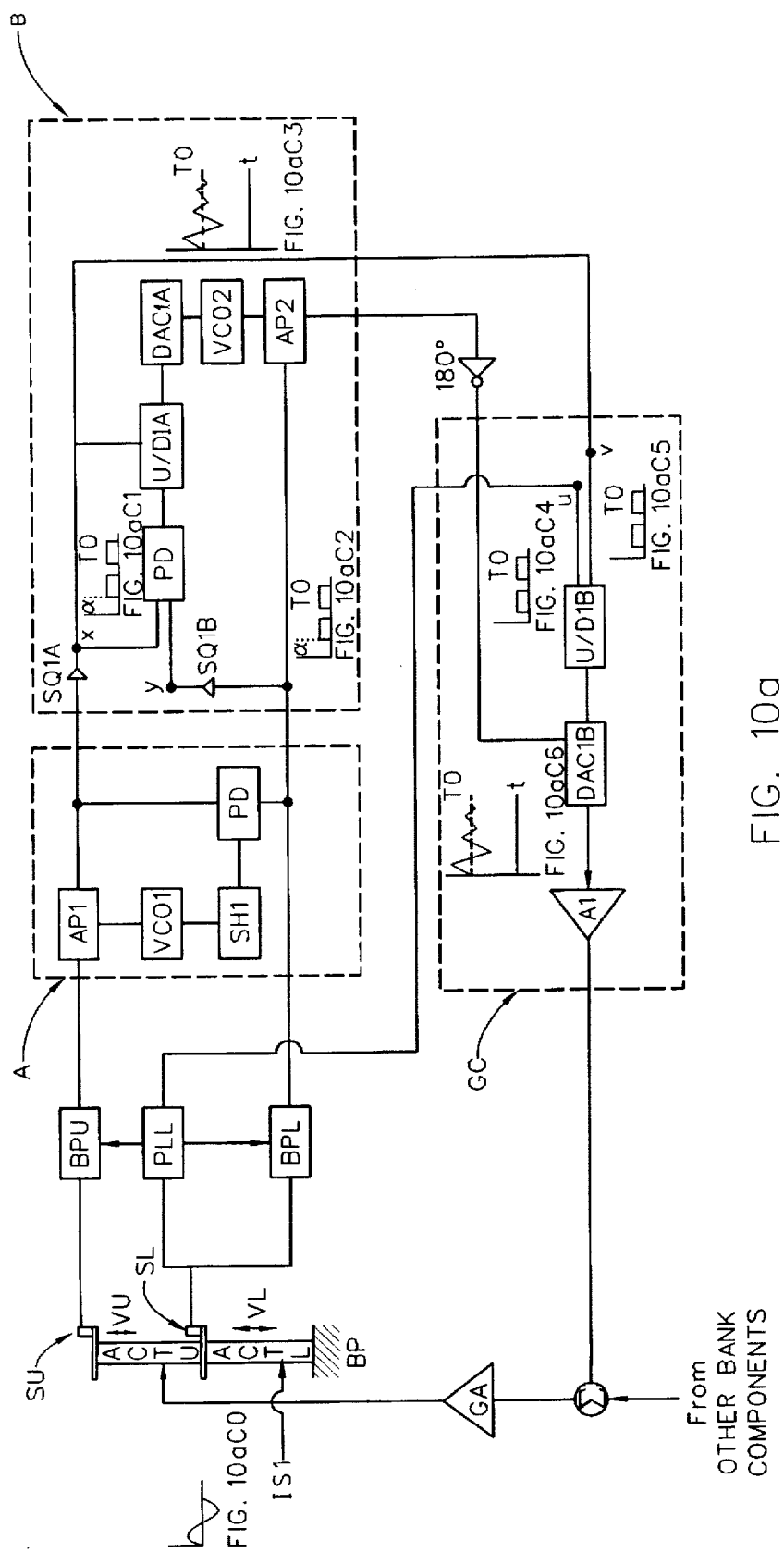
FIG. 10a shows a schematic diagram of a gain control circuit of an automated vibration compensating system embodiment of the present invention.

Turning now to FIG. 6, there is shown an alternative Phase Matching Circuit which in use operates to continuously place Out-of-Phase Input Signals (S1I) & (S2I), into phase with one another. That is, while the FIG. 5 Circuit Block A circuitry operates to place two out of phase Input Signals (S1I) & (S2I) into phase at a first point in time at which an "In-Phase" condition is met at the inputs to a Phase-Detector (PD), (which are the Output Signals (S1O) and (S2O)) of the FIG. 5 circuitry), and thereafter freeze the phase shifting effect of an All Pass Filter (APF) on the Output Signal (S1O), the FIG. 6 Circuitry acts to continuously seek to match the phase of an Input Signal (S2I) to that of another Input Signal (S1I) input to said FIG. 6 circuitry. Said FIG. 6 Circuitry operates by detecting differences in phase between two Input Signals (S1I) and (S2I), (see Signal Diagram FIGS. 6S1 and 6S2), again by use of a Phase Detector (PD). Note that the Input Signals (S1I) and the Input Signal (S2I) are shown offset from said reference by only Alpha ($\alpha$). This is a desired state. However, should the Signal (S1I) go out of phase with signal (S2I), a signal developed by the Phase Detector (PD) will be input to an Up/Down Counter (U/D), which in turn provides a digital signal output which is likewise representative of the phase difference between the two Input Signals (S1I) and (S2I). The digital signal output by the Up/Down Counter (U/D) is input to a Digital to Analog Converter (DAC), which Digital Analog Converter (DAC) in turn provides a varying magnitude analog signal to the input of a Voltage Controlled Oscillator (VCO), the Output Frequency Signal of which Voltage Controlled Oscillator (VCO) is input to an All Pass Filter (APF), which All Pass Filter (APF) then reacts to effect an appropriate phase shift in the Input Signal (S2I) such that the Output Signals (S1O) and (S2O), (see Signal Diagram FIGS. 6S3 and 6S4), are continuously caused to be out of phase by an amount which when applied via feedback circuitry, not shown in FIG. 6, (but see FIG. 10a), to control the phase of the Input Signal (S1I), causes Input Signals (S1I) and (S2I) to be matched in phase. The major difference between the FIG. 5 and FIG. 6 circuitry is that the FIG. 5 circuitry effects, (absent a reset), a one Time Phase Instant phase matching capability, whereas the circuitry of FIG. 6 provides continuous "Phase Matching" condition seeking action. As well, note that the FIG. 5 Phase Detector (PD) monitors the Output, (ie. Output Signals (S1O) & (S2O)), side of the FIG. 5 Circuitry, and the Phase Detector in the FIG. 6 Circuitry monitors the Input, (ie. Input Signals (S1I) and (S2I)), side thereof. Note that Waveform Squaring (SQ) components are also shown as present at the inputs to the FIG. 6 Phase Detector (PD). Waveform Squaring (SQ) components are preferably so utilized as it is easier to detect phase differenced between essentially vertically projecting edges of a waveform. It will be described supra, (see discussion with respect to FIG. 10a), that a preferred embodiment of the present invention provides that a FIG. 5 Circuit Block (A) provide signals output therefrom into a FIG. 6 Circuit Block (B) such that Output Signal (S2O) from said Circuit Block (B) is offset by Beta ($\beta$) from said FIG. 6 Output Signals (S1O) and such that said Circuit Block (A) Output Signals (S1O) and (S2O) are simultaneously caused to be in phase with one another. That is, an All Pass Filter (APF) of Circuit Block (B) Circuitry operates to provide an (S2O) with a nominal phase shift of Beta ($\beta$) with respect to a Circuit Block (B) Circuitry Output Signal (S1O), said Output Signal (S2O) being input to an Upper Actuator (ACTU) via Gain Control (GC) Circuitry, (see discussion of FIG. 10a). (Note that the term "nominal" is utilized to indicate that the FIG. 6 Circuit Block (B) serves to continuously seek, by operation of the Up/Down Counter, to maintain said Output Signals (S1O) & (S2O) at a Beta ($\beta$) offset in phase, such that Input Signals (S1I) and (S2I) applied thereto via circuitry shown in FIG. 10a are maintained in a phase matched condition via other circuitry actions, (Gain Control (GC) Circuitry action—note that Gain Control Circuitry is described in respect to FIG. 7 Circuitry), which can continuously serve to disrupt such, thereby requiring said Phase Matching seeking action.

Figure 9:
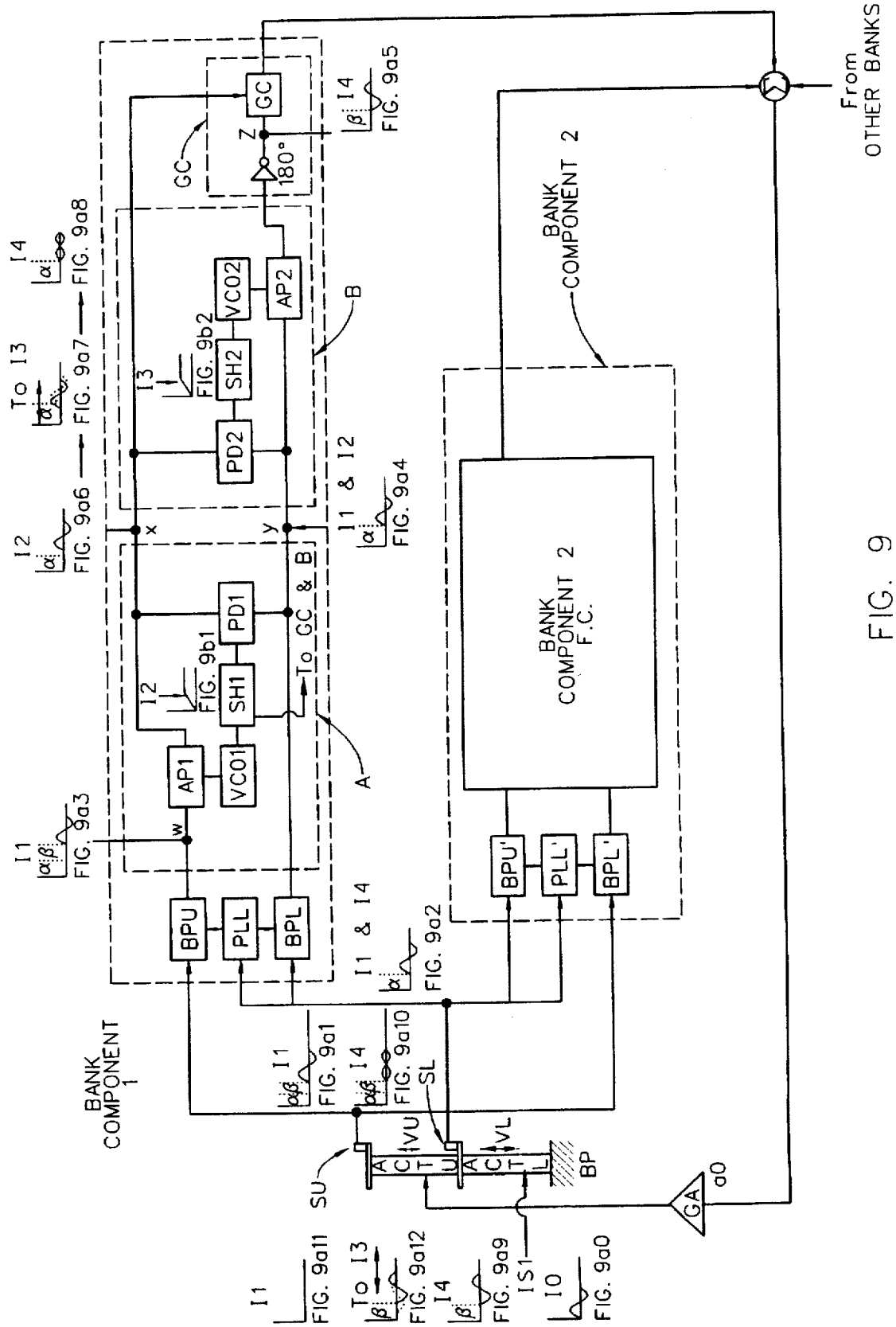
FIG. 9 shows a schematic diagram of two Bank Components of an automated vibration compensating system embodiment of the present invention.

It is to be noted that the Up/Down Counter and (U/D) and Digital to Analog Converter (DAC) of FIG. 6 could be replaced with a Sample and Hold (SH) Circuit, (as shown in FIG. 5 and FIG. 9 circuitry, but not shown in FIG. 6 per se.), to provide a circuit which will freeze a phase shift exiting All Pass Filter (APF) when signals entering such a modified FIG. 6 Circuit are caused to come into phase with one another. This would occur in a manner similar to discussed with respect to the FIG. 5 Sample and Hold (SH) circuitry operation, (but where the input signals to the FIG. 6 are caused to be matched in phase by said action). Regardless of which version of the circuitry of FIG. 6 is utilized in Circuit Block (B), (see FIGS. 9 and 10a), however, once Gain is imposed by Circuit Block (GC), (see FIG. 10a), the signals exiting Circuit Block (A), (which were caused to be in phase with one another by action of Circuit Block (A) operation), and which enter Circuit Block (B), will again go out of phase with one another. The action of Circuit Block (B) is to re-synchronize said Input Signals. This occurs when a FIG. 6 Input (S2I) signal entering All Pass Filter (AP2), (which signal can vary through successive three-hundred-sixty (360) degree cycles), has effected thereon a phase shift of Beta ($\beta$). That is, as described with respect to FIG. 10a, a combined effect of the imposition of Gain by Gain Control Circuit (GC) and the application of phase delay by the All Pass Filter (APF) of FIG. 6, is that the Output Signal (S2O) exiting the All Pass Filter (APF) of FIG. 6 is shifted in phase, by an amount Beta (β).

Figure 7:
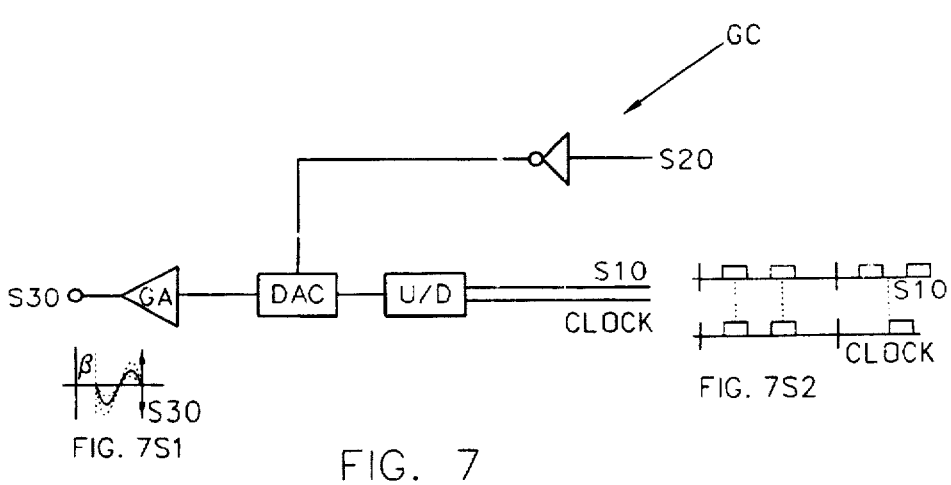
FIG. 7 show an embodiment of a gain control circuit utilized in present invention realization efforts to date.

Turning now to FIG. 7, there is shown a basic Gain Control (GC) Circuit with both Output Waveforms (S1O) & (S2O), (as provided by FIG. 6 circuitry), as well as a clock signal, (see FIG. 7S2), input thereto. The provision of a "Clock Signal" will be described supra herein, (see description regarding FIG. 8 for instance). It should be understood that the signal (S2O) input to the (DAC) sets a reference, which the signal (S1O), via the Up/Down Counter (U/D) serves to vary. (Note that the Up/Down Counter (U/D) output signal is developed by reference to the relative phase relationship of the (S1O) and Clock Signals). To better understand the Gain Control Circuitry, it is helpful to realize that the (DAC) comprises a resistor switching network in a feed-back loop of an Operational Amplifier. The (S1O) signal controls the effective resistance thereof in use by effecting the switching in, and out, of resistors in the switching network. The signal (S2O), however, feeds into a first resistor, which first resistor connects, at its opposite end, to the inverting terminal of the Operational Amplifier. The non-inverting terminal thereof is typically set to ground. The output of the Operational Amplifier, then, is be determined by the effective resistor ratio between the signal (S1O) effected Feed-Back Resistance, and said first resistor. The Magnitude of the Signal Output from the FIG. 7 Gain Control Circuit (GC) then varies in response to the signals input thereto, as demonstrate by the FIG. 7 Signal Out S3O, (see Signal Diagram FIG. 7S1).

Figure 8:
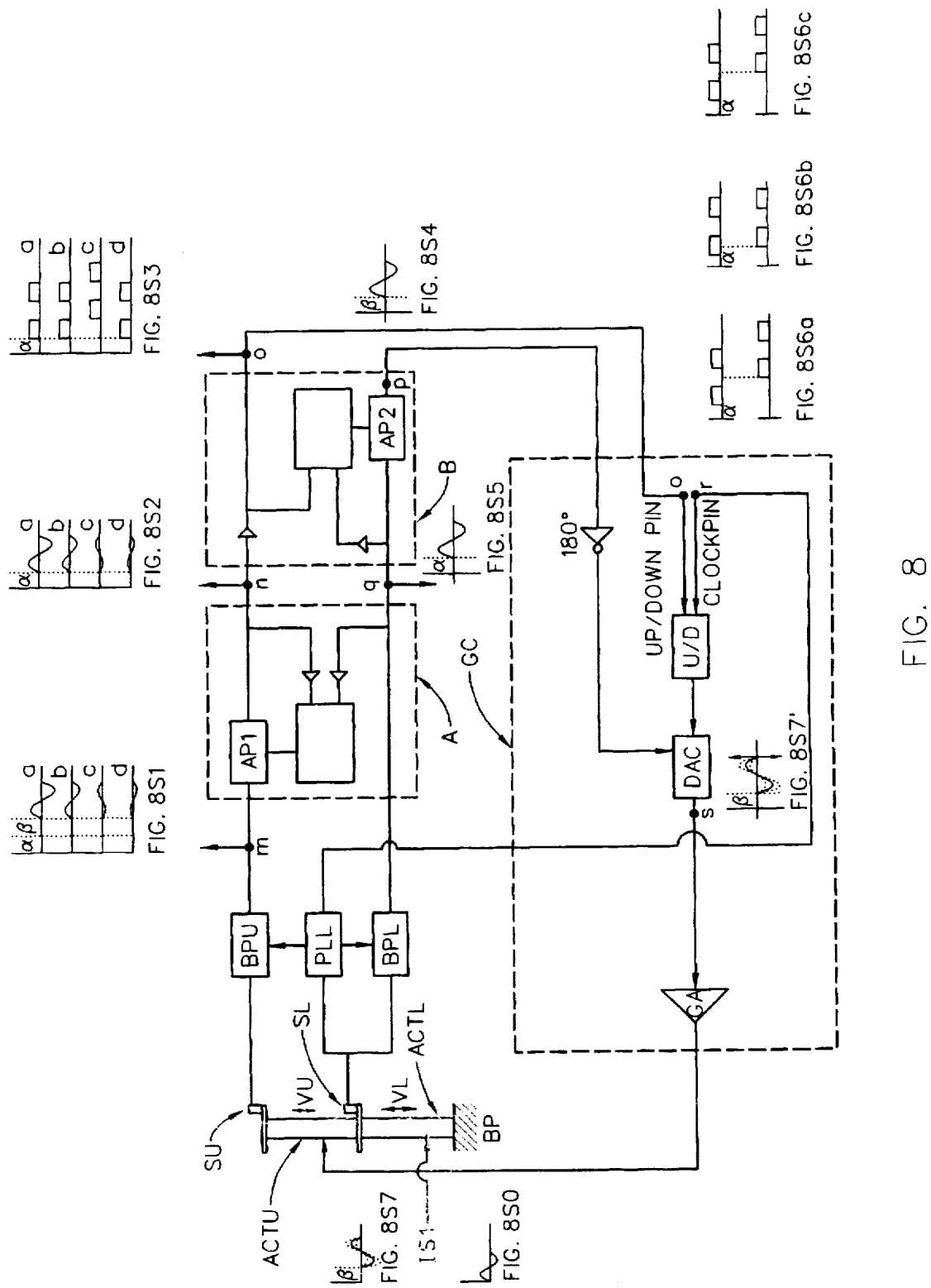
FIG. 8 shows a basic combined phase matching and gain control circuitry, automated vibration compensating system embodiment of the present invention.

FIG. 8 shows a basic composite representation of one Bank Component Automated Feed-Back Circuitry (FC) of the present invention, which composite representation applies regardless of which version of Phase Control Circuitry, (eg. a FIG. 6 Continuous Phase Match Seeking Circuit Block embodiment or a modified version thereof wherein a Sample and Hold (SH) Circuit replaces the Up/Down Counter (U/D) and Digital to Analog Converter (DAC) therein), is utilized at the location of Circuit Block (B). It is to be understood that Circuit Block (A) typically will utilize only FIG. 5 demonstrated Sample and Hold (SH) based Phase Control Circuitry, however. Shown in FIG. 8 are a Base Plate (BP), Lower (ACTL) and Upper (ACTU) Actuators, Lower (SL) and Upper (SU) Sensors, an Upper (BPU) and a Lower (BPL) Band Pass Filter, and a Phase Lock Loop (PLL). A Signal from the Lower Sensor (SL) is directed into the Phase Lock Loop (PLL1) and to the Lower Band Pass Filter (BPL), and a Signal from the Upper Sensor (SU) is directed into the Upper Band Pass Filter (BPU). In a full present invention system there are by a plurality of such Phase Lock Loop (PLL) and Upper (BPU) and Lower (BPL) Filter Banks present, each of which Phase Lock Loops and Band Pass Filters are caused to receive signals from the same Lower (SL) and Upper (SU) Sensors, with each such Bank of Components set to operate in a different frequency range, (See FIG. 1b for a general representation thereof). Now, an initial vibration causing signal (IS1) shown in Signal Diagram FIG. 8S0 is input to the Lower Actuator (ACTL). In response, signals from the Upper (SU) and Lower (SL) Sensors exit the Upper (BPU) and Lower (BPL) Band Pass Filters respectively, and are entered into a Circuit Block (A), (see time progressive representative Signal Diagram FIGS. 8S1a–8S1d), with signals exiting from said Circuit Block (A) being shown as entered to a Circuit Block (B), (see time progressive representative Signal Diagram FIGS. 8S2a–8S2d). Signals which exit said Circuit Block (B), (see time progressive Signal Diagram FIGS. 8S3a–8S3d and the Signal Diagram in FIG. 8S4), are shown as entered to Gain Control Circuit Block (GC), along with a Clock Signal, (see Signal Diagram FIGS. 8S6a, 8S6b & 8S6c), output from a Voltage Controlled oscillator in said Phase Lock Loop (PLL). A signal output from Gain Control Circuit Block (GC) is shown entered to the Upper Actuator (ACTU), (see Signal Diagram FIG. 8S7). As alluded to infra, the accompanying Signal Diagram FIGS. 8S1a, 8S1b, 8S1c, and 8S1d, show representative signals which are present at Circuit Point "m" at progressively increasing times after initiating input of signal (IS1), (shown in the Signal Diagram FIG. 8S0, to the Lower Actuator (ACTL) of said FIG. 8 circuit. Likewise, Signal Diagram FIGS. 8S2a, 8S2b, 8S2c, and 8S2d), show similar representative signals which occur at corresponding progressively increasing times, but at Circuit Point "n". Signal Diagram FIGS. 8S3a, 8S3b, 8S3c, and 8S3d, show similarly representative signals at corresponding progressively increasing times, but for Circuit Point "o". Note also that a signal, shown in Signal Diagram FIG. 8S5, exiting the Lower Band Pass Filter (BPL), and which is present at Circuit Point "q", is shown as offset by a phase shift of Alpha (α) from the vibration initiating Signal (IS1), which Vibration Initiating Signal is shown in the Signal Diagram FIG. 8S0 and is input to the Lower Actuator (ACTL). Note that Vibration Initiating Signal IS1 shown in Signal Diagram FIG. 8S0 serves as a phase Reference Signal for all other signals shown in FIG. 8.

Now, at the outset of operation of the FIG. 8 Composite Circuit, it is to be understood that Circuit Blocks (B) and (GC) are effectively "short circuits". That is their Magnitude and Phase Matching capabilities are "Disabled". Circuit Block (A), however, is "Enabled". The effect of the operation of Circuit Block (A) is to phase match the Signals exiting Circuit Block (A) to the signal exiting the Lower Band Pass Filter (BPL), (eg. see the various Signal Diagram FIGS. 8S2a–8S2d and FIG. 8S5 corresponding to Circuit Point "n" and Circuit Point "q" respectively). This is accomplished by the introduction of a Phase Shift, via Circuit Block (A) All Pass Filter (AP1), as described with respect to FIG. 5. While the magnitudes of the signals exiting the Circuit Block (A) change, (see Signal Diagram FIGS. 8S2a–8S2d), generally decrease with increasing time after application of Vibration Initiating Signal (IS1) to the lower Actuator (ACTL), thereby demonstrating Compensation of Vibrations present at the location of the Upper Sensor (SU) is accomplished), Circuit Block (A) serves, absent some reset thereof, to fix a matched phase relationship between said signals presenting at Circuit Point "n" and the signal presenting at Circuit Point "q" at some Time Phase Instant. (Note that this is typically accomplished with Sample and Hold based Circuitry as shown in FIG. 5). As mentioned, Circuit Block (B) and the Gain Control (GC) Block are effectively disabled during the foregoing discussed operation of Circuit Block (A). However, upon Circuit Block (A) Sample and Hold (SH) operation, it is to be understood that Circuit Block (A) imposed phase shift on the signal exiting the Upper Band Pass Filter (BPU) is effectively fixed, and Enabling Signals are provided from Circuitry Block (A) to Circuitry Block (B) and the Gain Control (GC) Circuitry Block. Upon being enabled, the Gain Control (GC) Block serves to begin increasing Gain to the signal shown in the Signal Diagram FIG. 8S7 input to the Upper Actuator (ACTU). This is demonstrated in the Signal Diagrams in FIGS. 8S7 and 8S7 by the presence of numerous Signals of various magnitudes. Application of Gain by Gain Control Circuitry Block (GC), however, effectively causes the signal from the Upper Sensor (SU), which exits the All Pass Filter (AP1) at Circuit Point "n", to again go out of phase with the signal at Circuit Point "q". Circuit Block (B) monitors said phase relationship between Circuit Points "n" and "g", at its input, and utilizing a Phase Detector Circuit at its input, (such as demonstrated in FIG. 6 by Phase Detector (PD)), serves to effectively provide a "Phase-Resynchronizing" effect via the imposition of phase shift via All Pass Filter (AP2). That is, in the presence of Gain Circuitry Block (GC) imposed Gain, signals at Circuit Points "n" and "q" are caused to come back into synchronized phase by the action of Circuit Block (B) action. Upon detecting that Phase Shifting Gain has been appropriately increased by Gain Control (GC) Circuitry Block, in combination with an appropriate Phase Shift being imposed by Circuit Block (B) All Pass Filter (AP2), such that the Phases of the Signals entering the Circuit Block (B) are again matched, Circuit Block (B) then operates to secure said matched Phases. If FIG. 6 Circuitry with Sample and Hold (SH) circuitry replacing the Up/Down Counter (UD) and the Digital to Analog Converter (DAC) circuitry, (as present in FIG. 5), is utilized, said Sample and Hold (SH) circuit simply operates and freezes the effect of All Pass Filter (AP2). If the Circuitry of FIG. 6 as shown is utilized as Circuit Block (B) in the FIG. 8 system, said FIG. 6 Circuitry operates to continuously seek to eliminate any such phase shifts which develop between signals at Circuit points "n" and "q" over time. In either case, the Signal output by the Circuit Block (B) All Pass Filter (AP2) will be positioned in phase such that the Signal caused to be input to the Upper Actuator (ACTU), is offset in phase from the Vibration Initiating Signal (IS1) input to the lower Actuator (ACTL), by an amount Beta ($\beta$). (See infra for a discussion of causes of said Beta ($\beta$) phase shift).

Continuing, FIG. 8 shows that the Gain Control Circuitry Block (GC), receives input signals from the output of Circuit Block (B), and from the Phase Lock Loop (PLL). The operation of said Gain Control Circuitry Block (GC) was described infra, with respect to FIG. 7, however, FIG. 8 additionally shows the origin of the Clock Signal is from the Phase Lock Loop (PLL). It is instructive to note that signals in Signal Diagram FIGS. 8S3$a$, 8S3$b$, 8S3$c$, and 8S3$d$, are repeated the Signal Diagram FIGS. 8S6$a$, 8S6$b$ & 8S6$c$ in comparison with the Phase Lock Loop output Timing Signal and serve to show the input the Gain Control (GC) Circuitry Up/Down Counter (U/D) receives from the Circuit Block (B) and the Phase Lock Loop (PLL) respectively at various points in time. The Signals in Signal Diagram FIGS. 8S3$a$, 8S3$b$, 8S3$c$ and 8S3$d$ are shown to vary with respect to the constant phase shift Phase Lock Loop signal shown in Signal Diagram FIGS. 8S6$a$, 8S6$b$ & 8S6$c$. When the Signals shown in Signal Diagram FIGS. 8S2$a$–8S2$d$ invert, (the result of an overcompensated Gain Magnitude Signal being applied to the Upper Actuator (ACTU), the Signals in Signal Diagram FIGS. 8S3$a$–8S3$d$ also invert, but as Squared-up Waves. Comparing the Phase Relationships of the Magnitudes of the Squared-up Waves entering the Up-Down Counter (U/D) in the Gain Control Circuitry Block (GC), shows that one of said Squared-up Waves will sometimes have a magnitude while the other does not, and at other times both will have magnitudes. Said relationship effects operation of the Up-Down Counter to appropriately increase or decrease output to the Gain Control Circuitry (DAC) in a manner which continuously serves to keep the signal from Circuit Block (B), (which enters the Gain Control (GC) Circuitry), in a desired relationship with that from the Phase Lock Loop (PLL). While an "in-phase" condition between the signals input to the Gain Control (GC) Circuitry is typically not achieved, the relative magnitudes of the signals input to the Up-Down Counter (U/D) sequentially continuously serve to cause the Gain imposed by the Gain Control (GC) circuitry to vary to both sides of an "in-phase" condition. This corresponds to effecting a Gain Control (GC) Circuit Block Signal output which is of an appropriate Magnitude to compensate the Magnitude of the Signal initially produced by the Upper Sensor (SU) in response to the vibrations introduced by the Lower Actuator (ACTL) due to the input of Signal (IS1).

With the foregoing generalized description in mind, attention is now directed to FIG. 9 wherein there is shown a more complete representation of one embodiment of a present invention Automated Vibration Compensation System comprising the Phase Lock Loop Bank based System of the present invention for decomposing, (and tracking decomposed components of), an electric signal of arbitrary frequency content into a user determined plurality or multiplicity of electric signals, each centered about a different center frequency. Shown is a Lower Vibration Sensor (SL) which is positioned to sense vibrations, (Feed-Forward Control), atop a Lower Actuator (ACTL) which serves to provide simulated vibrations, said simulated vibrations being identified as (VL). Lower Actuator (ACTL) is shown supported by a Base Plate (BP) which is assumed to be immovable. Atop said Lower Actuator (ACTL) is shown an Upper Actuator (ACTL), and atop said Upper Actuator (ACTU) is shown an Upper Sensor (SU). Said Upper Sensor (SU) serves to sense Vibrations, (Feed-Back Control), identified as (VU), which Vibrations (VU) are Vibrations (VL) after compensation thereof by Displacement effected by actuation of said Upper Actuator (ACTU), and it is to be noted that vibrations (VU) in FIG. 9$a$10 are shown as being of a compensated lesser magnitude than vibrations (VL) in FIG. 9$a$2. (It is to be understood that a System to be protected against vibrations will typically, in use, be present atop said Upper Actuator (ACTU)). The purpose of the presently described Vibration Compensation System application of the present invention is thus demonstrated, although it must be understood that initially, as one finds such a Vibration Compensation System, before application of the Vibration Compensation System capabilities thereof, (described supra), said magnitudes of (VL) and (VU) will be essentially similar. Ideally, the Vibration Compensation System serves to reduce the Magnitude of Vibrations (VU) to essentially Zero (0.0) in the presence of continuing Vibrations (VL) of a non-Zero Magnitude, by applying a compensation signal of appropriate Magnitude and proper Phase, (ie. a Signal as shown at Time Phase Instant (I4) in Signal Diagram FIG. 9$a$9, applied to Upper Actuator (ACTU)). How said Signal shown in Signal Diagram FIG. 9$a$9 is developed is a focal point of the presently disclosed embodiment of the present invention, as applied in a Vibration Compensation System, and can be understood by reference to the following discussion.

At the outset of an application of the presently described Automated Vibration Compensation System, Signals in Signal Diagram Figures identified with Time Phase Instant (I1) will be found to exist, (see Signal Diagrams in FIGS. 9$a$1, 9$a$2, 9$a$3, and 9$a$11 in Bank Component 1 Circuitry of FIG. 9. Note that no Signal is present in Signal Diagram FIG. 9$a$11 at Time Instant (I1), because Signal Diagram FIG. 9$a$11 represents a feed-back signal which has not yet had time to develop). Said identified Signals are an initial response to Signal (IS1), (see signal in Signal Diagram FIG. 9$a$0), being applied to the Lower Actuator (ACTL) at Time Phase Instant I0. Note that the term "Time Phase Instant" refers to a Signal Phase Relationship, at a time with respect to an arbitrary Zero (0.0) Time Phase Instant demonstrated in Signal Diagram FIG. 9a0. Also, each Signal Diagram FIG. 9a0–9a12, shows a Signal of an approximate SIN waveform over a period of time. Such is for demonstration purposes and it is to be understood that an actual Signal can be of any arbitrary waveform. In fact, Wave Squaring Circuitry, (not shown, but see FIG. 8 for instance), is typically present to convert at least some Sin-like Waves to Square Waves in preferred embodiments of the present invention. Continuing, Lower Vibration Sensor (SL) will provide a Vibration (VL) induced Signal as shown in Signal Diagram FIG. 9a2, in response to application of Signal (IS1) to the Lower Actuator (ACTL). Note that a Phase Shift of Alpha ($\alpha$), measured from the arbitrary common reference Zero (0.0) Time Phase point of Signal Diagram FIG. 9a0, is introduced in the signal of Signal Diagram FIG. 9a2 by said Lower Actuator (ACTL) and said Lower Vibration Sensor (SL). Simultaneously the Upper Vibration Sensor (SU) produces a signal as shown in Signal Diagram FIG. 9a1. Note that said signal shown in Signal Diagram FIG. 9a1 also has a phase delay Alpha ($\alpha$) introduced by Upper Vibration Sensor (SU), and an additional phase delay Beta ($\beta$) introduced as the Vibrations effected by the Lower Actuator (ACTL) travel through physically present components, (including the Upper Actuator (ACTU), to the location of the Upper Sensor (SU). (Note, for the purposes of simplifying the discussion herein it is assumed that Upper Actuator (ACTU) and Upper (SU) Vibration Sensor, as well as Lower Actuator (ACTL) and Lower (SL) Vibration Sensor both provide essentially identical Phase Shift responses, Alpha ($\alpha$), to Signals representing sensed Vibrations, but that a signal propagating from the location of Lower Vibration Sensor (SL) to Upper Vibration Sensor (SU) has entered an additional arbitrary Phase Shift of Beta ($\beta$), possible causes of which additional Phase Shift Beta ($\beta$) were identified infra herein).

Continuing, while understanding thereof is perhaps premature at this point, it is none-the-less beneficial to note that the signal shown in Signal Diagram FIG. 9a10, which occurs at Time Phase Instant(s) (I4), (see supra for description of when Time Phase Instant(s) (I4) occur in terms of presently described invention System operations), shows that a signal such as shown in Signal Diagram FIG. 9a9 applied to the Upper Actuator (ACTU) provides a compensated Sensed Signal result at Upper Vibration Sensor (SU), as demonstrated by reference to the signal shown in Signal Diagram FIG. 9a10. (Note that Signal Diagram FIG. 9a10 shows both over and undercompensated signals). That is Upper Sensor (SU) senses a reduced Magnitude Vibration and produces a Signal of greatly reduced Magnitude at a Time Phase Instant (I4), as compared to the Signal it produces at initial Time Phase Instant (I1), (which Time Phase Instant (I1) signal is represented in Signal Diagram FIG. 9a1). (For emphasis of the Compensation effect described, note that Lower Vibration Sensor (SL) produced Signal represented in Signal Diagram FIG. 9a2 is also valid at a Time phase Instant (I4)), and is of a greater, non-compensated, Magnitude. The end result of application of the present invention system then is to essentially compensate Vibrations sensed as present at said Lower Vibration Sensor (SL), such that Upper Vibration Sensor (SU) senses comparatively reduced amplitude Vibrations present thereat. To understand how the present invention System achieves the identified end result goal a careful step by step understanding of the remainder of the present invention System Circuitry shown in FIG. 9 is necessary. (It must also be specifically appreciated that Time Instant (I4) is actually a sequence of time instances which occur after Time Instant (I3), which Time Instant (I3) is described supra herein).

Continuing, note that two Bank Components, (eg. Bank Component 1 Feed-Back Circuitry shown and Bank Component Feed-Back Circuitry 2 indicated), are demonstrated in FIG. 9 for present invention Description purposes, but in general any number, (ie. a Plurality or Multiplicity), of Bank Components can be present. Each present Bank Component is focused upon processing a Signal in a Frequency Range which is typically different from that processed in other Bank Components. Also note that the signal from the Lower Sensor (SL), indicated by Signal Diagram FIG. 9a2, is simultaneously presented to inputs of Phase Lock Loops (PLL), (PLL') in Bank Components 1 and 2 respectively at Time Phase Instant (I1). Said Signal is also simultaneously presented to the inputs of Band-Pass Filters (BPL) and (BPL') in Bank Components 1 and 2 respectively at Time Phase Instant (I1). Also simultaneously, at Time Phase Instant (I1), the signal shown in Signal Diagram FIG. 9a1 is applied to the inputs of Band Pass Filters (BPU) and (BPU') in Bank Components 1 and 2 respectively. It is to be understood that Phase Lock Loops (PLL) and (PLL') are set to provide different Frequency Band Capture Ranges. That is, for instance, (PLL) might Capture, and Track, Frequencies centered about "500" Hz, while (PLL') is set to Capture, and Track, Frequencies centered about "1000" Hz, and the tracking or "Lock-In" Frequency Ranges of each Phase Lock Loop can be user set to be, for instance, "500" Hz. Again, while two Bank, (ie. Bank 1 and 2), Components, are demonstrated in FIG. 9, the present discussion should be understood to contemplate the presence of any number of Bank Components, each containing a Phase Lock Loop set to respond to a Frequency Range which typically differs from the Frequency Ranges responded to by Phase Lock Loops in other Bank Components. The end result is that the present invention provides a "Real-Time" plurality or multiplicity of independent signals, each of which is focused upon a particular Range of Frequencies, which Frequencies are selected by a user because, for instance, they are known or expected to be present in the Signals provided by Upper (SU) and Lower (SL) Vibration Sensors. This can be thought of as providing a Frequency Breakdown or Decomposition of said Signals, provided by said Upper (SU) and Lower (SL) Vibration Sensors, much as would result if a Fourier Series Analysis were performed thereupon, but with the added flexibility that the various Phase Lock Loops present need not necessarily be set to Harmonic Frequencies which reference to some Base Frequency, and with the benefit that said Phase Lock Loops operate in real-time. There are then essentially no restraints on the number of, or the Frequency Spread, of frequency ranges a user can select.

Next, it must be understood that the output of each Phase Lock Loop (PLL) and (PLL') serves to set the Center Frequency of Band Pass Filters ((BPU) & (BPL)), and ( (BPU') and (BPL')) respectively by, for instance, a Switched Capacitor Filter approach, using the output Frequency of a Phase Lock Loop feeding thereinto as a basis for said control. It is noted that commercially available Band Pass Filter Chips typically operate by being provided Center Band Frequency Controlling Input Frequencies which are a multiple of the Center Band Frequency thereof. In the present invention system, said Center Band Frequency controlling Input Frequencies is provided by an output from an associated Phase Lock Loop. However, said associated Phase Lock Loops of the present invention are capable of providing an output of a Frequency equivalent to the Band Pass Filter Center Frequency.

It is also to be appreciated that the Frequencies focused upon in Bank Components 1 and 2 etc., can "Drift" a bit in practice, and the Phase Lock Loops (PLL), (PLL') etc. can follow said Frequency change, thereby causing the Center Frequency of the associated Band Pass Filters (BPU) & (BPL) and ((BPU')) & (BPL') etc. to be varied so that the Signals fed thereto by Upper (SU) and Lower (SL) Vibration Sensors are optimally accommodated. That is, the Center Frequency, Zero (0.0) Phase Shift Frequencies of the Band Pass Filters are changed as Frequency Components "Drift".

It is to be appreciated that the presence of a Plurality of Phase Lock Loop and Center Frequency Controlled Band Pass Filter Containing Bank Components, as described infra, for the purpose of breaking a Signal into Component Frequencies, and following said Signals, is a major focal point of the present invention.

Continuing, observation of Time Phase Instant (I1) Signal Diagram FIGS. 9a1 & 9a3 and 9a2 & 9a4 shows that at the Center Frequencies of Bank Component 1 Band Pass Filters (BPL) and (BPU) respectively, said Band Pass Filters (BPU) and (BPL) have effectively no phase shift effect. (Note that Signal Diagram FIG. 9a3 is applicable at Circuit Point "w", and Signal Diagram FIG. 9a4 at Circuit Point "y" in FIG. 9). A similar statement of fact would also apply with respect to similar Signal Diagrams which would apply to Bank Component 2 and similar statements of fact will also apply to additional Bank Components when present.

Focusing on Bank Component 1 now, with the understanding that said discussion applies equally to any Bank Component present, it should be appreciated that the Signal in Signal Diagram FIG. (9a3) has an associated Alpha+Beta ($\alpha+\beta$) phase shift associated therewith, but the Signal shown in Signal Diagram FIG. (9a4) has a Phase Shift of Alpha ($\alpha$) associated therewith. As mentioned above, the Alpha ($\alpha$) phase shifts are essentially the result of the reaction time of the Upper Actuator (ACTU) & Upper Vibration Sensor (SU) and Lower Actuator (ACTL) & Lower Vibration Sensor (SL), and the Beta ($\beta$) Phase Shift results from time delay effects of a signal originated by Lower Actuator (ACTL) as it propagates through the Upper Actuator (ACTU) to the Upper Sensor (SU).

The present invention provides that a signal as shown in Signal Diagram FIG. 9a6, (which is essentially identical to that shown in Signal Diagram FIG. 9a4 at Time Phase Instant (I1)), be developed at a Time Phase Instant (I2), from the Signal shown as present at Time Phase Instant (I1) in Signal Diagram FIG. 9a3. (Note that Signal in Signal Diagram FIG. 9a4 is present at Circuit Point "y" in FIG. 9 and that the Signal in Signal Diagram FIG. (9a6) is present at Circuit Point "x" therein). To do this Circuitry Block identified as (A) is enabled, while Circuitry Blocks identified as (B) and (GC) have Phase Detector (PD2) and Gain Control (GC) are effectively disabled, (by circuitry means not shown). Phase Detector (PD1) is enabled, and serves to sense signals shown in Signal Diagram FIGS. 9a6 and 9a4 at Circuit Points "x" and "y" respectively. Note that unless All Pass Filter (AP1) alters the Signal shown in Signal Diagram FIG. 9a3 at Circuit Point "w", Signal Diagram FIG. 9a6 at Circuit Point "x" will be a duplicate thereof at any point in time. However, the present invention operates such that a Voltage Controlled oscillator (VCO1) is caused to have applied thereto an upward Ramping Voltage such as demonstrated by Signal Diagram FIG. 9b1. This causes said (VCO1) to provide an increasingly higher Frequency Output between Time Phase Instants (I1) and (I2), which increasingly higher Frequency is, as shown in FIG. 9, fed to an Input on All Pass Filter (AP1). Said All Pass Filter (AP1) translates said increasingly higher Frequency Signal input thereto into a Phase Shift entered into the Signal shown in Signal Diagram FIG. 9a3, and such continues until Phase Detector (PD1) detects that the Signals at Signal Diagram FIG. 9a6 and at Signal Diagram FIG. 9a4 are in phase. At this Time Phase Instant (I2), the Sample and Hold (SH1) circuit stops the (VCO1) Ramping Voltage and thereafter, (unless reset by circuitry not shown), holds it constant. That is, unless the presently discussed Circuitry Block (A) is reset by some means, (not shown), the phase shift introduced by said Circuit Block (A) All Pass Filter (AP1) will not change after Time Phase Instant (I2), and thereafter provides a constant Phase Shift of "Minus" Beta ($\beta$) to the Signal shown in Signal Diagram FIG. 9a3 to provide essentially the Signal in Signal Diagram FIG. 9a6, which at said Time Phase Instant (I2) has a Phase Shift equivalent to the Signal in Signal Diagram FIG. 9a4. The Time Phase Instant (I2) is then that point in time when the Sample and Hold (SH1) circuit sets said (VCO1) Voltage level to a thereafter constant value, and the point in time at which the Signals entering Circuitry Block (B), indicated by Signal Diagram FIGS. 9a6 and 9a4 at Circuit Points "x" and "y" respectively, are first in phase).

It will be noted that Sample and Hold (SH1) circuit is also shown to provide an enabling output signal, and associated enabling circuitry, (not shown), indicated as going to Circuitry Blocks (GC) and (B). Circuitry Block (GC) represents the circuitry containing a One-Hundred-Eighty (180) Degree Phase Shifter and Gain Control (GC) system, (shown in block form at the right of FIG. 9), and Circuitry Block (B) is a second Phase Detector containing Circuit, similar to the circuitry in Circuit Block (A). (Note that Gain Control (GC) Circuitry is better represented by FIG. 7 and accompanying discussion). The operating characteristics of the Gain Control Circuitry (GC) are that it initially, upon being enabled by Circuitry Block (A), causes an increasing Gain to be imposed upon an entering signal, but later, after Sample and Hold (SH2) in Circuit Block (B) operates, is caused to receive an input from Upper Band Pass Filter (BP1U) via All Pass Filter (AP1), and output a signal in response which has as its goal the keeping of the signal at Circuit Point "x" at a minimum as represented by the Signal in Signal Diagram FIG. 9a8). At instant (I2) then, Circuitry Block (GC) is enabled, and said Circuitry Block (GC) then serves to provide an increasingly higher Magnitude Gain to the Upper Actuator (ACTU), via the Summation Circuit ($\Sigma$) and Gain Amplifier (GA), between Time Phase Instants (I2) and (I3). (Note the discussion herein applies equally to Bank Components 1 and 2 etc., with the Summation Circuit providing a means for producing a combined signal from all Bank Components present prior to applying said combined composite signal to said Upper Actuator (ACTU). For purposes of discussion however, only Signal Diagram FIGS. 9a9, 9a11, 9a12 and 9a10 are shown in FIG. 9 with Signal Diagrams (a9'), (a11'), (a12) and (a10') and similar signals for other Bank Components to be understood as also present by analogical reference thereto). Continuing, application of said Increasingly higher Magnitude approximately one-hundred-eighty (180) degree out of phase Gain Signal to the Upper Actuator (ACTU) will cause the Signal at the Input to Circuitry Block (B), at Circuit Point "x", to change to that demonstrated and represented by the Signal shown in Signal Diagram FIG. 9a7, (that is, as said Signal in Signal Diagram FIG. 9a7 becomes more controlled by the Signal input to the Upper Actuator (ACTU), said Signal in Signal Diagram FIG. 9a7 will no longer be in phase with the Signal shown in Signal Diagram FIG. 9a4, at Circuit Point "y", which Signal in Signal Diagram FIG. 9a4 is derived from the electric signal provided by Lower Sensor (SL). When the input, (rather than output as in the case of Circuit Block (A)), signals to Circuit Block (B), (ie. Circuit Points "x" and "y"), are out of phase, the Phase Detector (PD2) therein will, via a Sample and Hold (SH2) and Voltage Controlled Oscillator (VCO2) cause All Pass Filter (AP2) to impose a phase shift thereon. At some appropriate amount of applied Gain Control Circuitry (GC) and Circuit Block (B) All Pass Filter (AP2) impose phase shift, however, the Phase of the signals shown in Signal Diagram FIGS. 9a7 and 9a4 will come into phase, again both at a phase shift Alpha ($\alpha$) from the arbitrary reference provided by the Signal in Signal Diagram (a0). Note that a Signal in Signal Diagram (a5) is simultaneously shown to exit the All Pass Filter (AP2) at a Phase Shift of Beta ($\beta$). Note that the signal in Signal Diagram 9a5 is shown after an Inverter, hence, at the Time Phase Instant (I3), when the signals in Signal Diagram FIGS. 9a7 and 9a4 are "re-synchronized", the signal in Signal Diagram FIG. 9a5 is at a Phase Shift of Beta ($\beta$) with an Inverted Magnitude. As mentioned, at Time Phase Instant (I3), the Sample and Hold (SH2) in Circuit Block (B) operates, and freezes the phase shift applied by All Pass Filter (AP2). Signal Diagram FIG. 9a12 depicts a signal input to the Upper Actuator (ACTU) approaching and after Time Instant (I3) by the described circuitry operation. Operation of Circuit Block (B), in the presently described FIG. 9 embodiment of the present invention, is thus similar to that of the described Circuit Block (A), but the phase difference of signals input to Circuit Block (B) is effected by Gain applied to the signal input to Upper Actuator (ACTU), by the Block (GC) Gain Control Circuitry.

As shown by Signal Diagram FIG. 9a8, application of varying Gain by Circuit Block (GC) will then cause the signal shown in Signal Diagram FIG. 9a7 to become of increasingly smaller magnitude, and finally "Invert", as compared to the Signal in Signal Diagram FIG. 9a6. That is, the Magnitude of the Signal at Circuit Point "x" will become "Overcompensated" and the Vibrations sensed by Upper Sensor (SU) will be primarily caused by the Overcompensation Factor in the Upper Actuator (ACTU). The Gain Control Circuitry (GC), by means of Feed-Back sensing, then acts to reduce the Gain provided thereby. Said Feed-Back effected Gain Control Circuitry (GC) action is thereafter continuous with the end result that the signal shown in Signal Diagram FIG. 9a8 is forced to stay near zero (0.0). This involves alternating periods of under and overcompensation. Signal Diagram FIG. 9a5 at circuit point "z" shows that at Time Phase Instant (I4) the signal entering, (and exiting), the Summation Circuitry ($\Sigma$), and applied to the Upper Actuator (ACTU) will be effectively Beta ($\beta$)+One-Hundred-Eighty (180) Degrees, (see Signal Diagram FIG. 9a9), out of Phase with an effective signal caused by application of Input Signal (IS1) to the Lower Actuator (ACTL), which corresponds to the Time Phase Instant (I1) & (I4) signal shown in Signal Diagram FIGS. 9a1 & 9a10, with the Alpha ($\alpha$) Phase Shift due to the Upper Actuator (ACTU) and Upper Sensor (SU) removed therefrom. Note that Signal Diagram FIG. 9a12 shows a signal which should be understood to vary in phase until Time Instant (I3), and then vary in Magnitude thereafter, (eg. at Time Instants (I4)), to provide the signal alluded to. The result of applying the Signal shown in Signal Diagram FIG. 9a9 at Time Phase Instants (I4), to the Upper Actuator (ACTU), is the Compensated Signal shown in Signal Diagram FIG. 9a10 at Time Phase Instants (I4). (Note a similar Signal Diagram for signal (a10') for Bank Component 2 and similar Signal Diagrams for other Bank Component signals are to be understood as simultaneously applicable). These of course correspond, at Time Phase Instant (I4') to the Signals in a Signal Diagram FIG. 9a8' present at a Circuit Point (x') in a Bank Component 2. (As alluded to above, a similar procedure to that described infra with respect to Bank Component 1 Circuitry, is applied in each Bank Component, (ie. Frequency Range), in a present invention System and the Signal applied to the Upper Actuator (ACTU) is a Summed result. Additional Signal Diagrams equivalent to Signal Diagrams FIGS. 9a9, 9a11, 9a12 and 9a10 etc. could be, but are not, provided to show how Signals from Bank Components other than Bank Component 1 are handled).

The overall effect of the above described process is that a Developed Signal which is essentially Beta ($\beta$)+one-hundred-eighty (180) degrees out of phase with, and of an appropriate Magnitude as compared with a Signal initially effectively present at the input to the Lower Actuator (ACTL), is automatically arrived at and applied to said Upper Actuator (ACTU) to the end that said Upper Actuator (ACTU) is caused to react and effect a compensating displacement to counter an initial Vibration Sensed by Lower Sensor (SL). Thus the Vibration sensed by Upper Vibration Sensor (SU) will be compensated, (ie. smaller), as compared to the Vibration sensed by Lower Vibration Sensor (SL).

The presently described embodiment of the present invention then allows Decomposing an Original Signal into a plurality or multiplicity of Frequency Component Containing Signal Bands in real time; the Magnitude and Phase processing of said Frequency Component Containing Signal Bands independently, and the automatic development and application of a summed and Amplified Signal to an Upper Actuator (ACTU), which Summed Signal contains Frequency Band Components which are of appropriate Phase and Magnitude to cause an Actuator to operate to cancel corresponding Frequency Band Components in said Original Signal, at a sensing location physically offset from the origin of the Original Signal, (ie. the Signal (IS1) input at the Lower Vibration Sensor (SL), by the intervening Upper Actuator (ACTU)). A particularly relevant application of the present invention is then, in Vibration Compensation. It is beneficial, at this point, to again mention that the Phase Lock Loops (PLL) and (PLL') can track changes in a Frequency Component and cause configuration of Band Pass Filters (BPU) & (BPL) and (BPU') & (BPL') so that their Center Frequency Zero (0.0) phase shift points track said Frequency changes.

Again, it is to be noted that the Lower Actuator (ACTL) is not present in a typical application of the present invention. Said Lower Actuator (ACTL) is included in this Disclosure only to provide a vibration source signal, to which the phase of other signals described can be conveniently referenced.

Turning now to FIG. 10a there is shown a single Bank Component of an alternative, but also preferred embodiment of the present invention, with the Gain Control Circuitry of FIG. 7 demonstrated, (which Gain Control Circuitry, it is noted, is typically also utilized as the Gain Control Circuitry (GC) in each Bank Component of the FIG. 9 demonstrated circuitry). As well, it is to be understood that FIG. 10a provides circuitry which integrally performs the overall function of the circuitry of the Circuitry Block (B) and the Gain Control Circuit (GC) in FIG. 9. That is, FIG. 10a circuitry involves a "Combined Function" version of FIG. 6

Circuit Component (B) Phase adjusting, and FIG. 7 Gain Control (GC), circuitry. In particular, it is to be appreciated that a FIG. 9 Time Phase Instant (I3) fixing of the (VCO2) output is not relevant in the FIG. 10a embodiment. Rather, (VCO2) output is caused to be continuously varied in use. How this is accomplished was discussed with respect to FIG. 7, and should become clear by the discussion supra.

Now, the above discussion of the circuitry of FIG. 9 served to identify Time Phase Instants (I1), (I2), (I3) and (I4) at which specific circuit functions occurred. Said specific circuit functions being instrumental to producing a vibration compensating signal for input to the Upper Actuator (ACTU). The FIG. 10a circuitry achieves essentially the same end result, but the Time Phase Instant designations are not an appropriate approach to description. At the outset of said description of the circuitry of FIG. 10a it must then be understood that "Phase Time Conditions" (T0), (T1) and (T2) provide a more direct approach. "Phase Time Conditions", it must be appreciated, are "Conditions" of relative Phase between two Signals at the inputs of Up/Down Counters, and not sequentially increasing Instants in Time as represented by Time Phase Instants (I1) through (I4) as described with respect to FIG. 9. Phase Time Conditions will occur in some sequence over time, as roughly represented by the Signals in the Signal Diagram FIGS. 10aC3 and 10aC6 and in FIG. 10d, but they do not necessarily occur in any specific sequence, (although the goal is to arrive at Phase Time Condition (T0)) at some point in time.

It should be noted that Circuit elements (SU), (SL), (ACTL), (ACTU), (PLL), (BPU) and (BPL) are configured as described with respect to FIG. 9. Note also that Circuitry Block (A) is typically the same circuitry as described with respect to FIG. 9. Circuitry Block (A), it will be recalled, serves to initially phase synchronize Signals present at Circuit Points "x" and "y" and freeze a phase shift imposed upon the Signal exiting an All Pass Filter (AP1), at Circuit Point "x" at Time Instant (I2). This compensates the Alpha ($\alpha$) Phase Shift as was described with respect to the FIG. 9, (and FIG. 5), circuitry and as is represented by the FIG. 10a Signal Diagram FIGS. 10aC1 and 10aC2 in which the Signals shown therein are in phase with the phase delay applied to Signal in Signal Diagram FIG. 10aC1, by All Pass Filter (AP1) is considered to be frozen in phase at Time Phase Instant (I2) by operation of a Sample and Hold circuit (SH1)). Again, said circuit action was described with respect to the FIG. 9 Circuit Block (A) circuitry.

Figure 10D:
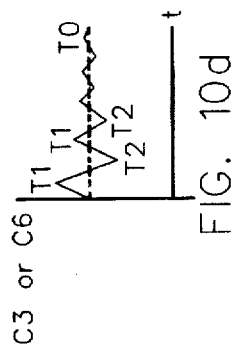

Continuing, it is to be noted that FIG. 10a additionally shows Squaring elements (SQ1) and (SQ2), (ie. Zero-Crossing Detectors), Up/Down Counters (U/D1A) & (U/D1B), Digital to Analog Converters (DAC1A) & (DAC1B) and Amplifier (A1). Said Squaring elements (SQ1) & (SQ2) serve to provide Rectangular shaped wave signals out, when provided other than Rectangular shaped waves in, (eg. SIN waves). The inclusion of Squaring Elements (SQ1A) (SQ1B) make Phase Relationships between the Signals C1 & C2, and C4 & C5, (shown individually in Signal Diagram FIGS. 10aC1, 10aC2, 10aC4 and 10aC5), in FIGS. 10b and 10c easier to utilize, and visualize. (Note that Squaring Elements can also, and typically are, present in the FIG. 9 circuitry and when present the Signal Diagrams shown therein would show signals of Rectangular Wave shape. Squaring Elements could be considered as included in Circuit Elements in FIG. 9, at inputs thereto in a preferred embodiment). FIG. 10a shows Circuit Points "x" & "y", and "u" & "v", with Signal Diagram FIGS. 10aC1 & 10aC2 and 10aC4 & 10aC5 serving to provide representations of Rectangular-Waves thereat, In-Phase with one another, at a Phase Time Condition (T0). When this Phase Time Condition (T0) exists at FIG. 10aCircuit Points "x" & "y", it is to be understood that the Settled Condition as represented in Time Signal Diagram 10aC3, to the right therein, will exist, and a Phase Shift provided by All-Pass Filter (AP2) will be essentially constant. (Note that the signal in FIG. 10aC3 is output by Digital to Analog Converter (DAC1A)). This will occur as the Up/Down Counter (U/D1A) output will be stabilized. Similarly, Up/Down Counter (U/D1B) will also see no phase shift between signals at inputs at FIG. 10a Circuit Points "u" & "v" when a Phase Time Condition (T0) is present, and will provide a Settled Condition as shown in Time Signal Diagram FIG. 10aC6, to the right therein. (Note that the signal in FIG. 10aC6 is output by Digital to Analog Converter (DAC1B)). When these conditions exist, (DAC1A) and (DAC1B) will provide essentially constant outputs. However, when a phase difference exists between signals at Circuit Points "x" & "y", or between Circuit Points "u" & "v", (as demonstrated by Phase Time Conditions (T1) and (T2) in the Signal Diagram in FIGS. 10b and 10c, respectively, the Up/Down Counters (U/D1A) and (U/D1B), respectively will be caused to provide a changing output. The Phase Difference condition of FIG. 10b, for instance, can cause an Increasing Up/Down Counter Output and the Phase Difference condition of FIG. 10c can cause a Decreasing Up/Down Counter Output. The end goal result being that the Phase Condition of Phase Time Condition (T0) be achieved at some point in time. (Note that FIG. 10d shows this situation in more detail. That is, Phase Time Conditions (T1) and (T2) repeat, and the presently described circuitry operates to cause Phase Time Condition (T0) to be achieved).

Figure 10C:
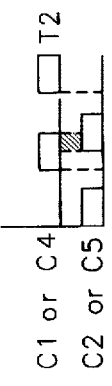
Figure 10B:
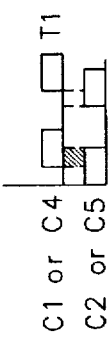

Now, note that the Signal at FIG. 10a Circuit Point "x" is provided from Upper Sensor (SU) directly from Upper Band Pass Filer (BPU) via All Pass Filter (AP1), and that the Signal at Circuit Point "y" is provided by Lower Sensor (SL) and passed through Lower Band Pass Filter (BPL). Note also that the FIG. 10a Circuit Points "u" & "v" receive their Signals from a Phase Lock Loop (PLL1) Output, (from a Voltage Controlled Oscillator therein), and Circuit Point "x" respectively. (Note the Phase Lock Loop output signal indicated is of the same Frequency as that exiting said Associated Second Band Pass Filter). Similarly to the description with respect to FIG. 7 and FIG. 9 circuitry, at the outset of operation, after signals at FIG. 10a Circuit Points "x" & "y" are synchronized, the Gain of Digital to Analog Converter (DAC1B) is changed to effect better compensation between signals detected by Upper (SU) and Lower (SL) Sensors, and the Phase of the Signal at Circuit Point "x" will change with respect to that at FIG. 10a Circuit Point "y", as represented by FIG. 10b and/or FIG. 10c. (In the context of the circuitry of FIG. 9 this will be triggered at time Instant (I2)). This will cause Up/Down Counters (U/D1A) & (U/D1B) to see Signals at their inputs which are out of phase. Said Up/Down (U/D1A) & (U/D1B) Counters then individually operate to cause the respective sequentially following Digital to Analog Converters (DAC1A) & (DAC1B) to effect a signal over time as shown in Signal Diagram FIGS. 10aC3 and 10aC6 respectively. For instance when a Phase Time Condition (T1) as shown in FIG. 10b is present the leading edge of the Signal present at Circuit Point "x" or Circuit Point "u" will be present within the portion of the Signal present at Circuit Point "y" or "v" which is positive going. When the Phase Time Condition (T2) shown in FIG. 10c is present said leading edge of the Signal present at Circuit Point "x" or Circuit Point "u" will be present within the portion of the Signal present at Circuit Point "y" or "v" which is negative going. (Note that "x" and "y" refer to C1 and C2 in FIGS. 10b & 10c and will tend to be "Phase-Matched", while "u" and "v" refer to C4 & C5 in FIGS. 10b & 10c and will tend to be "Phase-Shifted" in operation). These differentiable Time Phase conditions are utilized to cause the Up/Down Counters (U/D1A) and (U/D1B) to Count Up or Count Down for periods which represent the degree, (see cross-hatched regions in FIGS. 10b and 10c), of Phase Difference of the Signals input thereto. The Outputs of Up/Down Counters (U/D1A) and (U/D1B) are provided to Digital Analog Converters (DAC1A) and (DAC1B) respectively, the outputs from which are, respectively, shown in Time Signal Diagram FIGS. 10aC3 and 10aC6. When the Phase Time Condition (T0) is achieved at the inputs to an Up/Down Counter, its output will remain constant, and the condition of compensation will be achieved, yielding a constant Digital to Analog Converter output. (It is to be understood that the Signals in Time Phase Condition Signal Diagram FIGS. 10aC1, 10aC2, 10aC4 and 10aC5 shown are not sequential in time as are the signals C3 and C6 shown in Time Signal Diagram FIGS. 10aC3 and 10aC6, but rather represent Phase Conditions which occur at various times during the operation of the presently described circuitry). Responses to relationships between Time Phase Conditions of inputs to an Up/Down Counter, (ie. (U/D1A) or (U/D1B)), whenever they occur in Time, cause Time Signal Responses as shown in Time Signal Diagram FIGS. 10aC3 and 10aC6. For instance, it is possible that a Time Signal as shown in Time Signal Diagram FIGS. 10aC3 and 10aC4 will repeat at later times, (not shown), in response to some step disturbance in the Phases of Signals Input to an Up/Down Counter, (U/D1A) or (U/D1B).

Briefly, the presently described FIG. 10a Bank Component circuitry then first serves to effect Phase Synchronization, (ie. Phase Time Condition (T0)), between signals caused to be present at FIG. 10a Bank Component Circuit Points "x" & "y", (via (All Pass Filter (AP1)), in Circuit Block (A) at Time Instant (I2), using FIG. 9 Time Instant terminology); then fixes the Phase Shift of the Signal present at Circuit Point "x" in each Bank Component entered by the All Pass Filter (AP1), by fixing (AP1) imposed Phase Shift via Circuit Block (A) Sample and Hold (SH1) circuitry. Next said FIG. 10a circuitry changes Gain, (via the (DAC1B)), in each Gain Control (GC) circuit in each Bank Component, to the signal produced therein which, via a Summation Circuit which sums all such signals for all present Bank Components, to attempt to effect a Phase Time Condition (T0) between Circuit Points "u" & "v", the effect of which (DAC1B) effected applied Gain causes a Phase Shift to develop between signals present at FIG. 10a Circuit Points "x" & "y" in each bank Component thereby effecting a Phase Time Condition (T1) or (T2) thereat. FIG. 10a circuitry then simultaneously adjusts Gain, (via (DAC1B)), and the Phase, (via (DAC1A)), in each Bank Component to the end that, simultaneously, a Phase Time Condition (T0) between Circuit Points "x" & "y" and between Circuit Points "u" & "v" in each Bank Component is achieved or actively sought. Educated insight should now make it obvious that the FIG. 10a Circuitry serves to operate simultaneously and continuously to effect a Phase Time Condition (T0) between FIG. 10a Circuit Points "x" & "y" and between FIG. 10a Circuit Points "u" & "v". And, when said simultaneous Phase Time Condition (T0) between FIG. 10a Circuit Points "x" & "y" and between FIG. 10a Circuit Points "u" & "v" exists, vibrations sensed by "Feed-Back Control" Signal sensing Upper Sensor (SU) will be maintained at a minimum as compared to "Feed-Forward Control" Signal sensing Lower Sensor (SL) because Magnitude and Phase will be appropriately adjusted.

It is again noted that while only one Bank Component has been shown and described in FIG. 10a through 10d, similar circuitry and discussion applies in a plurality of present Bank Components, (as was described with respect to FIG. 9 and also demonstrated in FIG. 1b).

Figure 11A:
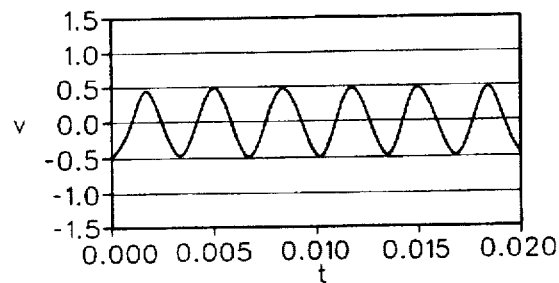
FIG. 11a shows a vibration effecting voltage waveform input to a Lower Actuator (ACTL) such as in FIG. 9.
Figure 11B:
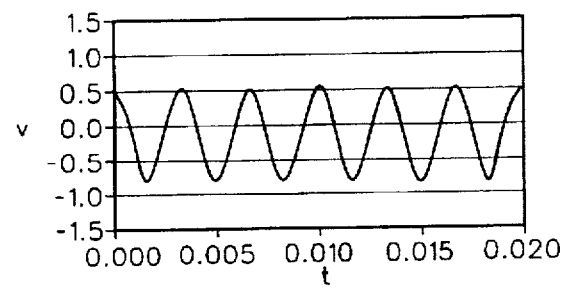
FIG. 11b shows a feed-back signal developed by a Bank Component, as is FIG. 9, and input to an Upper Actuator (ACTU).
Figure 11C:
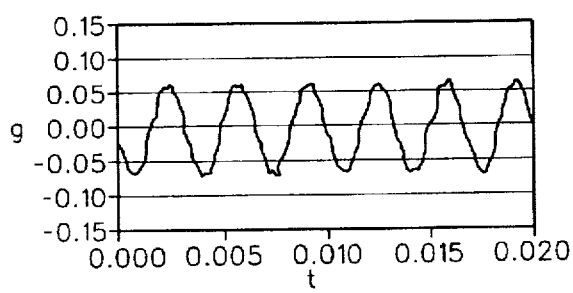
FIG. 11c shows a acceleration signal output from a Lower Sensor (SL) as in FIG. 9.
Figure 11D:
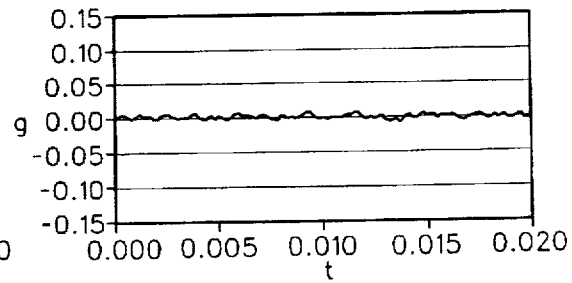
FIG. 11d shows an acceleration signal output by an Upper Sensor (SU) as in FIG. 9, simultaneously with the signal shown in FIG. 11c.
Figure 11E:
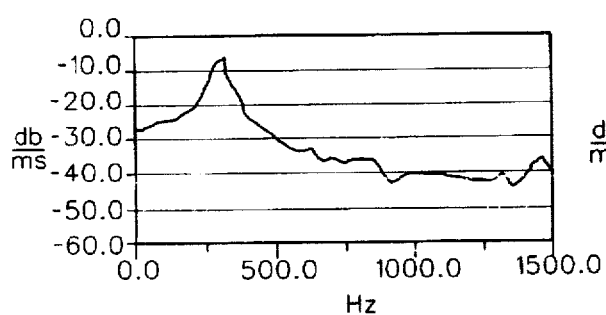
FIGS. 11e and 11f show simultaneous frequency spectrums for the signals in FIGS. 11c and 11d.
Figure 11F:
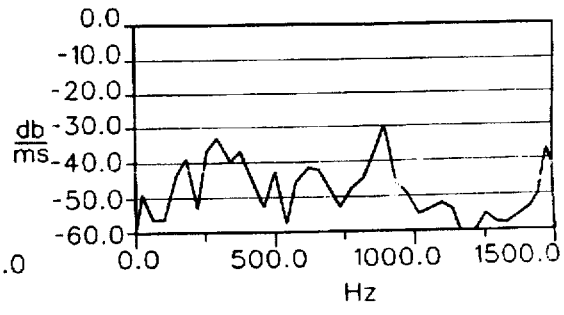
Figure 12A:
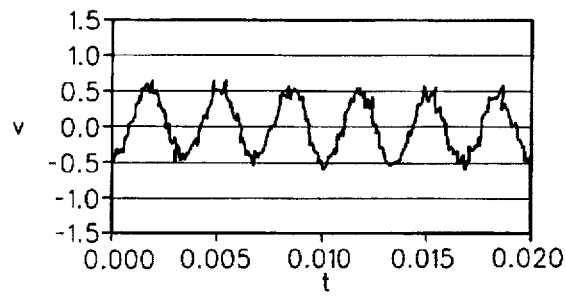
FIG. 12a shows a "noisy" vibration effecting voltage waveform input to a Lower Actuator (ACTL) such as in FIG. 9.
Figure 12B:
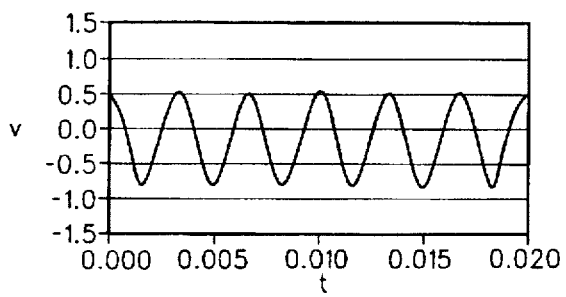
FIG. 12b shows a feed-back signal developed by a Bank Component, as is FIG. 9, and input to an Upper Actuator (ACTU).
Figure 12C:
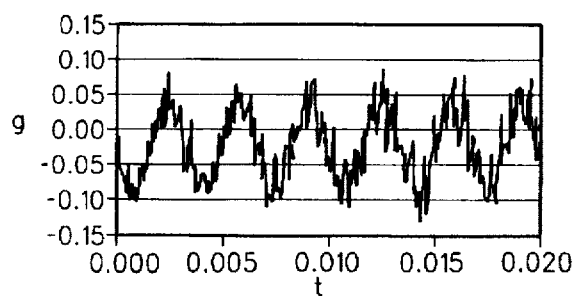
FIG. 12c shows a acceleration signal output from a Lower Sensor (SL) as in FIG. 9.
Figure 12D:
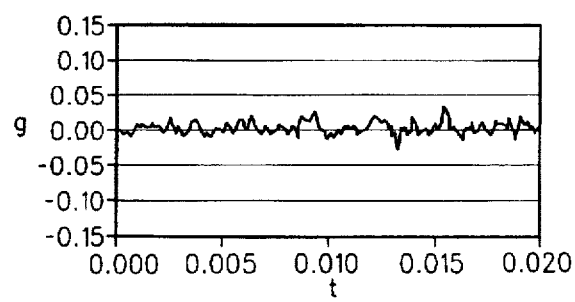
FIG. 12d shows an acceleration signal output by an Upper Sensor (SU) as in FIG. 9, simultaneously with the signal shown in FIG. 12c.
Figure 12E:
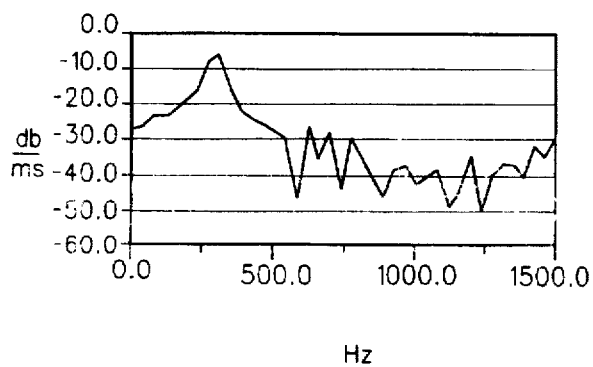
FIGS. 12e and 12f show simultaneous frequency spectrums for the signals in FIGS. 12c and 12d.
Figure 12F:
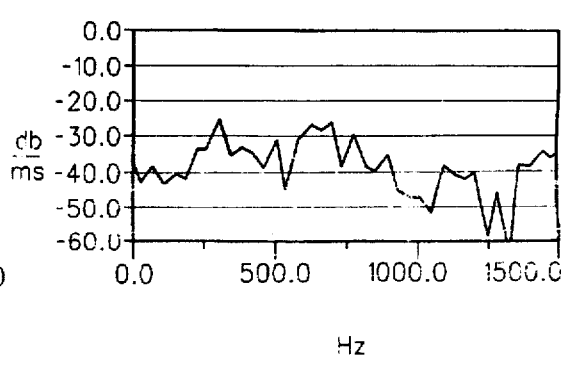

FIGS. 11a–11f and 12a–12f show actual experimental results obtained from a present invention system. FIGS. 11a and 12a each show a voltage signal waveform input to a Lower Actuator (ACTL) to effect vibrations. FIG. 11a differs from FIG. 12a in that "noise" is superimposed upon a primary waveform. FIGS. 11b and 12b each show voltage waveforms provided to the input of an Upper Actuator, as provided by a single Bank Component, (as shown for instance, in FIG. 9). FIGS. 11c and 12c show accelerations detected by a Lower Sensor (SL), and FIGS. 11d and 12d show respective corresponding simultaneous accelerations detected by an Upper Sensor (SU) when a signal as in FIGS. 11a and 12a is input to a Lower Actuator (ACTL), and a signal such as in FIGS. 11b and 12b, (fedback from a Bank Component as in FIG. 9), is input to an Upper Actuator. Note that the signals in FIGS. 11d and 12d are of greatly reduced magnitudes. The signal in FIG. 12d shows the presence of "noise" as present in the signal of FIG. 12a.

From the foregoing, it should then be appreciated that the present invention, in any of its embodiments, serves to decompose a signal of arbitrary frequency content into a plurality or multiplicity, (taken to means two or more without limitation on an upper limit), of signals, each of which signals is centered about a user defined variable, (Phase Lock Loop Tracking), center frequency and is of a Band Pass Filter determined Bandwidth. Each of said plurality or multiplicity of signals is provided by a Phase Lock Loop and Band Pass Filter combination. Said plurality of signals are then each subjected to Phase and Magnitude Compensation. In applications, such as a vibration control system wherein vibrations provide initial signals, the resulting frequency band representing signals which have been subjected to Phase and Magnitude Compensation are summed and amplified, and the result is then applied to an Actuator, (identified as an Upper Actuator (ACTU) in the foregoing). Said Phase and Magnitude Compensation can be achieved by use of constructed Look-Up Tables, or by Automated Circuitry. In the case where Look-Up Tables are utilized, a single Feed-Forward Control, (ie. Open-Loop), or Feed-Back Control, (ie. Closed-Loop), signal can be provided by an Lower Sensor (SL) or by an Upper Sensor (SU) respectively in a vibration control system. In the automated compensation case, both said Feed-Forward and Feed-Back Control Signals are utilized. The Automated Phase and Magnitude Compensation can be accomplished by various circuitry, with preferred new and novel embodiments thereof being described infra herein, particularly with respect to FIGS. 8, 9 and 10a.

It is to be noted that in the foregoing each Lower Band Pass Filter (BPL) and Upper Band Pass Filter (BPU) are, respectively, generally the Bank Component specific Phase Lock Loop (PLL) Associated First and Second Band Pass Filters discussed in the Disclosure of the Invention Section herein. As well, the Lower (SL) and Upper (SU) Sensors are generally the First, (Feed-Forward Control Signal Sensing), Vibration Sensor, and Second (Feed-Back Control Signal Sensing), Vibration Sensor discussed in the Disclosure of the Invention Section of this Disclosure.

Furthermore, while a "Hardware" Component approach has been used in synthesizing presented present invention embodiments, it is to be appreciated that a Software approach to implementation of the present invention is also possible. That is, computer program equivalents to various electronic circuit components can be utilized. The Claims are to be interpreted to include such Software Equivalents to Hardware components within the Hardware Terminology.

It is also noted that while Actuator produced "Displacement" was used as demonstrative in the foregoing, any Action produced by an Actuator which serves to effect Compensation as monitored by an Upper Sensor (SU), is to be considered as equivalent for the purposes of Claim construction.

It is also noted that a plural form of the work "vibration", (ie. "vibrations"), has been used throughout this Disclosure. This is not to be interpreted to imply significance as a limitation as used in the Claims, but rather should be considered a means of indicating that a vibration consisting of multiple frequencies can be simultaneously present, and/ or that a vibration of one or more frequencies can be present at sequentially different times.

Finally, it is disclosed that various Integrated Circuit Chips are available to perform the functions described, examples being:
Phase Lock Loops (PLL):
National Semiconductor LM565/LM565C; and
Motorola MC54/74HC4046A.
Digital to Analog Converters (DAC's):
National Semiconductor DAC0830/DAC0831/DAC0832.
Switched Capacitor Filter (BPU),(BPL):
National Semiconductor MF10.

Having hereby disclosed the subject matter of this invention, it should be obvious that many modifications, substitutions and variations of the present invention are possible in light thereof. It is therefore to be understood that the invention may be practiced other than as specifically described, and should be limited in breadth and scope only by the Claims.

We claim:

1. A system for decomposing an original signal of arbitrary frequency content into a user determined plurality of signals, each of which plurality of signals is centered about a variable center frequency, said system comprising a bank of a plurality of combination phase lock loop and associated band pass filter bank components, the center frequency of a frequency pass band of each of said band pass filters being effected by use of a signal input thereto, and output by, an associated phase lock loop, each of which phase lock loops is set to provide user desired capture and lock-in frequency ranges; such that in use each of said combination phase lock loop and associated band pass filter bank component is provided the original signal at inputs of said phase lock loop and associated band pass filter, and such that in use a well defined phase lock loop output signal is caused to be provided by a phase lock loop and utilized by an associated band pass filter to set a passband center frequency thereof, and enable utilized band-pass filter output therefrom, if said original signal presents with a frequency component within the capture and lock-in ranges of said associated phase lock loop, and said phase lock loop is locked thereonto; each said band pass filter center frequency, once set, being, in use, continuously caused to vary if, and when, the frequency component in said original signal which effects a well defined output signal from an associated phase lock loop, which output is input to an associated band pass filter, and which frequency component of said original signal which said associated band pass filter is passing, varies within its associated phase lock loop's lock-in range.

2. A system for decomposing an original signal of arbitrary frequency content as in claim 1 in which said original signal is an electric signal which monitors vibrations in a physical system, said physical system comprising an intervening actuator which is situated therein such that appropriate activation thereof can serve to compensate said sensed vibrations at a location offset from a source of said vibrations by said intervening actuator, each of which plurality of signals from each of which plurality of band pass filters, is caused to be magnitude and phase adjusted, then summed and applied to said actuator, with the effect being that vibrations present at said source of vibrations are essentially compensated at said location offset therefrom by said intervening actuator.

3. A system for decomposing an original signal of arbitrary frequency content as in claim 2 in which said original signal is provided by a sensor located so as to sense feed-forward/open-loop vibration at the source thereof.

4. A system for decomposing an original signal of arbitrary frequency content as in claim 2 in which said original signal is provided by a sensor located so as to sense feed-back/closed-loop vibration at the location offset from said source of vibrations by said intervening actuator.

5. A system for decomposing an original signal of arbitrary frequency content as in claim 2, in which the magnitude and phase of each of which plurality of signals are adjusted by reference to a "look-up" table which provides magnitude and phase modification specifications when provided with a signal frequency and phase.

6. A system for decomposing an original signal of arbitrary frequency content as in claim 2 in which the original signal is provided by a sensor which monitors a feed-forward/open-loop source of vibration, the magnitude and phase of each of which plurality of signals are adjusted based upon a feed-back/closed-loop signal provided by a sensor which monitors compensated feed-back/closed-loop vibration at a location offset from said source of vibrations by said intervening actuator, which feed-back signal enables automated determination of appropriate magnitude and phase modifications for application to each of said plurality of signals in real time.

7. A vibration compensating system which decomposes an original electric signal of arbitrary frequency content into a user determined plurality of variable center frequency electric signals for separate processing; said vibration compensating system comprising a bank of a plurality of combination phase lock loop and associated first band pass filter bank components, the center frequency of a frequency pass band of each of said associated first band pass filters being effected by use of a signal input thereto, and output by, an associated phase lock loop, each of which phase lock loops is set to provide user desired capture and lock-in frequency ranges; such that in use each of said combination phase lock loop and associated first band pass filter bank components is provided the original electric signal at inputs thereof from a first vibration sensor, which first vibration sensor monitors vibrating system open-loop vibration, and such that in use a well defined phase lock loop output electric signal is caused to be provided by a phase lock loop and utilized by said associated first band pass filter to set a passband center frequency thereof, and enable utilized band pass filter output therefrom, if said original electric signal presents with a frequency component within the capture and lock-in ranges of said associated phase lock loop and said phase lock loop is locked thereonto; each said associated first band pass filter center frequency, once set, being, in use, continuously caused to vary if, and when, the frequency component in said original electric signal which effects a well defined output signal from an associated phase lock loop, which output is input to an associated first band pass filter, and which frequency component of said original signal which said associated first band pass filter is passing, varies within its associated phase lock loop's lock-in range; each of which phase lock loop and associated first band pass filter bank components further comprises a associated second band pass filter, which associated second band pass filter in each bank component is simultaneously provided frequency passband center frequency effecting electric signal input thereto, and output by, the same associated phase lock loop which provides center frequency effecting electric single to said associated first band pass filter in said bank component, such that center frequency of said associated second band pass filter is set, and caused to vary in a manner the same as that of said associated first band pass filter; which associated second band pass filter is caused to receive an input electric signal from a second vibration sensor, which second vibration sensor monitors closed-loop vibration at a location physically offset from the location at which said open-loop vibration monitoring first vibration sensor is located by an intervening actuator, and which second vibration sensor provides an output electric signal with a frequency component within the frequency pass band of said associated second band pass filter; such that in use signals are developed by appropriate magnitude and phase modifications to the signal from said associated first band pass filter in each bank component, which magnitude and phase modifications are based upon the signal exiting said associated second band pass filter in each bank component, with said magnitude and phase adjusted signals from various bank components being summed and provided to said actuator such that it is caused to respond with a physical action response which compensates said vibration sensed by said first vibration sensor such that said second vibration sensor is caused to sense a reduced magnitude vibration.

8. A vibration compensation system as in claim 7 in which said signal provided to said actuator which is produced by summing adjusted magnitude and phase signals produced by bank components present, is arrived at by first causing the electric signal which exits said associated second band pass filter in each bank component to be phase matched with the electric signal exiting said associated first band pass filter at bank component specific time phase instants, then by causing, in each bank component, gain to be imposed upon said resulting electric signal which exits said associated first band pass filter, said gain affected resulting electric signal being applied to said actuator via a one-hundred-eighty degree phase shift and summation circuit simultaneous with other such electric signals developed in other present bank components, with the result being that said electric signals exiting each said associated second band pass filters in each bank component are caused to shift in phase and such that phase shift is applied to said electric signal exiting said first band pass filters in each bank component to the end that, at bank component specific time phase instants the electric signals exiting both the first and associated second band pass filters in each bank component are again phase matched with one another, followed by continued feed-back effected gain adjustment of the electric signal exiting said associated first band pass filter in each bank component; the end result being that the electric signal resulting from summation of electric signals from present bank components which is caused to be applied to said actuator is such that action caused to be developed by said actuator, is continuously simultaneously of essentially equal magnitude and essentially one-hundred-eighty degrees out of phase with vibrations present at the source thereof, which vibrations are sensed by said first vibration sensor, such that the vibrations sensed by said second vibration sensor are of reduced magnitude as compared to the magnitude of vibrations sensed by said first vibration sensor.

9. A vibration compensation system as in claim 7 in which said signal provided to said actuator which is produced by summing adjusted magnitude and phase signals produced by bank components present, is arrived at by first causing the electric signal which exits said associated second band pass filter in each bank component to be phase matched with the electric signal exiting said associated first band pass filter at bank component specific time phase instants, then by causing, in each bank component, gain to be imposed upon said electric signal being applied to said actuator via said summation circuit simultaneous with other such electric signals developed in other present bank components, with the result being that said electric signals exiting each said associated second band pass filter in each bank component are caused to shift in phase; followed by the continuous application of varying gain to the signal applied to the actuator after summation with similarly processed signals from each bank component, said gain being determined by a phase difference in signals from the output of associated said second band pass filter and said phase lock loops in each bank component, and simultaneous continuous phase shift to the electric signals exiting the associated first band pass filter in each bank component, to again place the electric signals exiting both the associated first and associated second band pass filters in each bank component into phase with one another; the end result being that the electric signal resulting from summation of electric signals from present bank components which is caused to be applied to said actuator is such that action caused to be developed by said Actuator, is continuously simultaneously of essentially equal magnitude and one-hundred-eighty degrees out of phase with vibrations present at the source thereof, which vibrations are sensed by said first vibration sensor, such that the vibrations sensed by said second vibration sensor are of reduced magnitude as compared to the magnitude of vibrations sensed by said first vibration sensor.

10. A vibration compensation system as in claim 8, wherein the electric signal which exits said associated second band pass filter in each bank component is caused to be phase matched with the electric signal exiting said associated first band pass filter at a bank component specific time phase instants by causing a ramping voltage to be input to a voltage controlled oscillator, an output frequency of which is caused to be input to an all pass filter which reacts by imposing a phase shift to the signal exiting a band pass filter selected from the group consisting of said associated first and said second band pass filters, said ramping voltage being caused to remain at a level corresponding to said phase matched condition when a phase detector senses an in-phase condition at the output of said all pass filter and triggers a sample and hold circuit.

11. A vibration compensation system as in claim 9, wherein the electric signal which exits said associated second band pass filter in each bank component is caused to be phase matched with the electric signal exiting said associated first band pass filter at a bank component specific time phase instants by causing a ramping voltage to be input to a voltage controlled oscillator, an output frequency of which is caused to be input to an all pass filter which reacts by imposing a phase shift to the signal exiting a band pass filter selected from the group consisting of said associated first and said second band pass filters, said ramping voltage being caused to remain at a level corresponding to said phase matched condition when a phase detector senses an in-phase condition at the output of said all pass filter and triggers a sample and hold circuit.

12. A vibration compensation system as in claim 8, wherein the electric signal exiting both the associated first and associated second band pass filters in each bank component are caused to again be phase matched with one another, after causing gain to be imposed upon said electric signal which exits said associated first band pass filter and thereby, via a summation circuit and application of said signal to said actuator, causing the signal exiting said associated second band pass filter to become out of phase with said signal exiting said associated first band pass filter, which prior to application of gain was caused to be phase matched with the electric signal exiting said second associated band pass filter; wherein a ramping voltage is input to a voltage controlled oscillator, an output frequency of which is caused to be input to an all pass filter which reacts by imposing a phase shift to the signal exiting a band pass filter selected from the group consisting of said associated first and said second band pass filters, said ramping voltage being caused to remain at a level corresponding to said phase matched condition when a phase detector senses an in-phase condition at the input to said all pass filter and triggers a sample and hold circuit.

13. A vibration compensation system as in claim 9, wherein the electric signal exiting both the associated first and associated second band pass filters in each bank component are caused to again be phase matched with one another, after causing gain to be imposed upon said electric signal which exits said associated first band pass filter and thereby, via a summation circuit and application of said signal to said actuator, causing the signal exiting said associated second band pass filter to become out of phase with said signal exiting said associated first band pass filter, which prior to application of gain was caused to be phase matched with the electric signal exiting said associated second band pass filter; wherein a phase detector monitors said signals exiting said associated first and second associated band pass filters in each bank component, and effects, via an up/down counter and a digital to analog converter, an alternatingly upward and downward ramping voltage to be input to a voltage controlled oscillator, an output frequency of which is caused to be input to an all pass filter which reacts by imposing a phase shift to the signal exiting a band pass filter selected from the group consisting of said associated first and said second band pass filters, the upward and downward direction of said ramping voltage being determined by the relative phase between said signals detected by said phase detector at the input to said all pass filter.

14. A method of decomposing an original signal into a user determined plurality of signals, each of which signals is centered about a variable center frequency, comprising the steps of:

a. obtaining a system for decomposing an original signal of arbitrary frequency content into a user determined plurality of signals, each of which signals is centered about a variable center frequency, said system comprising a bank of a plurality of combination phase lock loop and associated band pass filter bank components, the center frequency of a frequency pass band of each of said band pass filters being effected by use of a signal input thereto, and output by, an associated phase lock loop, each of which phase lock loops is set to provide user desired capture and lock-in frequency ranges; such that in use each of said combination phase lock loop and associated band pass filter bank components is provided the original signal at inputs thereof, and such that in use a well defined phase lock loop output signal is caused to be provided by a phase lock loop and utilized by an associated band pass filter to set a passband center frequency thereof, and enable utilized band pass filter output therefrom, if said original signal presents with a frequency component within the capture and lock-in ranges of said associated phase lock loop and said phase lock loop is locked thereonto; each said band pass filter center frequency, once set, being, in use, continuously caused to vary if, and when, the frequency component in said original signal which effects a well defined output signal from an associated phase lock loop, which output is input to an associated band pass filter, and which frequency component of said original signal which said associated band pass filter is passing, varies within its associated phase lock loop's lock-in range;

b. setting the capture and lock-in frequency ranges of each phase lock loop present; and c. applying an arbitrary frequency content original signal to inputs of the phase lock loops and band pass filters of said system for decomposing an original signal of arbitrary frequency content;

d. monitoring the output signals from at least some of said plurality of band pass filters.

15. A method of decomposing an original signal into a user determined plurality of signals, each of which signals is centered about a variable center frequency as in claim 14 in which application of said original signal involves accessing an electric signal provided by a sensor which monitors vibrations in a physical system, said physical system comprising an intervening actuator which is situated therein such that appropriate activation thereof can serve to compensate said sensed vibrations at a location offset from a source of said vibrations by said intervening actuator, each of which plurality of signals from each of which plurality of band pass filters, is caused to be magnitude and phase adjusted as directed by a user, then summed and applied to said actuator, with the effect being that vibrations present at said source of vibrations are essentially compensated at said location offset therefrom by said intervening actuator.

16. A method of decomposing an original signal into a user determined plurality of signals, each of which signals is centered about a variable center frequency as in claim 15, in which the step of applying an original signal involves accessing a sensor located so as to sense feed-forward/open-loop vibration at the source thereof.

17. A method of decomposing an original signal into a user determined plurality of signals, each of which signals is centered about a variable center frequency as in claim 15, in which the step of applying an original signal involves accessing a sensor located so as to sense feed-back/closed-loop loop vibration at the location offset from said source of vibrations by said intervening actuator.

18. A method of decomposing an original signal into a user determined plurality of signals, each of which signals is centered about a variable center frequency as in claim 15 in which the magnitude and phase of each of which plurality of signals are adjusted by reference to a "look-up" table which provides magnitude and phase modification specifications when provided with a signal frequency and phase.

19. A method of decomposing an original signal into a user determined plurality of signals, each of which signals is centered about a variable center frequency as in claim 15 in which the original signal is provided by a sensor which monitors an open-loop source of vibration, and which method further comprises the step of modifying the magnitude and phase of each of which plurality of signals based upon a closed loop signal provided by a sensor which monitors compensated feed-back loop vibration at a location offset from said source of vibrations by said intervening actuator, which feed-back signal enables automated determination of appropriate magnitude and phase modifications for application to each of said plurality of signals in real time.

20. A method of compensating vibrations in a vibrating system comprising the steps of:

a. providing a vibration compensating system to said vibrating system, which vibration compensating system decomposes an original electric signal of arbitrary frequency content into a user determined plurality of variable center frequency electric signals for separate processing; said vibration compensating system comprising a bank of a plurality of combination phase lock loop and associated first band pass filter bank components, the center frequency of a frequency pass band of each of said associated first band pass filters being effected by use of a signal input thereto, and output by, an associated phase lock loop, each of which phase lock loops is set to provide user desired capture and lock-in frequency ranges; such that in use each of said combination phase lock loop and associated first band pass filter bank components is provided the original electric signal at inputs thereof from a first vibration sensor, which first vibration sensor monitors vibrating system Open-loop vibration, and such that in use a well defined phase lock loop output electric signal is caused to be provided by a phase lock loop and utilized by said associated first band pass filter to set a passband center frequency thereof, and enable utilized band pass filter output therefrom, if said original electric signal presents with a frequency component within the capture and lock-in ranges of said associated phase lock loop and said phase lock loop is locked thereonto; each said associated first band pass filter center frequency, once set, being, in use, continuously caused to vary if, and when, the frequency component in said original electric signal which effects a well defined output signal from an associated phase lock loop, which output is input to an associated first band pass filter, and which frequency component of said original signal which said associated first band pass filter is passing, varies within its associated phase lock loop's lock-in range; each of which phase lock loop and associated first band pass filter bank components further comprises a associated second band pass filter, which associated second band pass filter in each bank component is simultaneously provided frequency passband center frequency effecting electric signal input thereto, and output by, the same associated phase lock loop which provides center frequency effecting electric single to said associated first band pass filter in said bank component, such that a center frequency of said associated second band pass filter is set, and caused to vary in a manner the same as that of said associated first band pass filter; which associated second band pass filter is caused to receive an input electric signal from a second vibration sensor in said vibrating system, which second vibration sensor monitors closed-loop vibrations at a location physically offset from the location at which said open-loop vibration monitoring first vibration sensor is located by an intervening actuator, and which second vibration sensor provides an output electric signal of a frequency within the frequency pass band of said associated second band pass filter; such that in use signals are developed by appropriate magnitude and phase modifications to the signal from said associated first band pass filter in each bank component, which magnitude and phase modifications are based upon the signal exiting said associated second band pass filter in each bank component, with said magnitude and phase adjusted signals from various bank components being summed and provided to said actuator such that it is caused to respond with a physical action response which compensates said vibration sensed by said first vibration sensor such that said second vibration sensor is caused to sense a reduced magnitude compensated vibration;

b. setting the capture and lock-in ranges of each present phase lock loop;

c. causing signals to be input to said phase lock loops and first band pass filters from said first vibration, feedforward signal open-loop vibration monitoring sensor, and causing signals from said second vibration sensor, which monitors feed-back signal closed-loop vibrations in said vibrating system, to be input to said second band pass filters.

21. A method of compensating vibrations in a vibrating system as in claim 20 in which said signal provided to said actuator which is produced by summing adjusted magnitude and phase signals produced by bank components present, is arrived at by first causing the electric signal which exits said associated second band pass filter in each bank component to be phase matched with the electric signal exiting said associated first band pass filter at a bank component specific time phase instants, then by causing, in each bank component, gain to be imposed upon said resulting electric signal which exits said associated first band pass filter, said gain affected resulting electric signal being applied to said actuator via a one-hundred-eighty degree phase shift and summation circuit simultaneous with other such electric signals developed in other present bank components, with the result being that said electric signals exiting each said associated second band pass filters in each bank component are caused to shift in phase and such that phase shift is applied to said electric signal exiting said first band pass filters in each bank component to the end that, at bank component specific time phase instants the electric signals exiting both the first and associated second band pass filters in each bank component are again phase matched with one another, followed by continued feed back effected gain adjustment of the electric signal exiting said associated first band pass filter in each bank component; the end result being that the electric signal resulting from summation of electric signals from present bank components which is caused to be applied to said actuator is such that action caused to be developed by said Actuator, is continuously simultaneously of essentially equal magnitude and essentially one-hundred-eighty degrees out of phase with vibrations present at the source thereof, which vibrations are sensed by said first vibration sensor, such that the vibrations sensed by said second vibration sensor are of reduced magnitude as compared to the magnitude of vibrations sensed by said first vibration sensor.

22. A method of compensating vibrations in a vibrating system as in claim 20 in which said signal provided to said actuator which is produced by summing adjusted magnitude and phase signals produced by bank components present, is arrived at by first causing the electric signal which exits said associated second band pass filter in each bank component to be phase matched with the electric signal exiting said associated first band pass filter at a bank component specific time phase instants, then by causing, in each bank component, gain to be imposed upon said electric signal being applied to said actuator via said summation circuit simultaneous with other such electric signals developed in other present bank components, with the result being that said electric signals exiting each said associated second band pass filter in each bank component are caused to shift in phase; followed by the continuous application of varying gain to the signal applied to the actuator after summation with similarly processed signals from each bank component, said gain being determined by a phase difference in signals from the output of said associated second band pass filter and said phase lock loops in each bank component, and simultaneous continuous phase shift to the electric signals exiting the associated first band pass filter in each bank component, to again place the electric signals exiting both the associated first and associated second band pass filters in each bank component into phase with one another; the end result being that the electric signal resulting from summation of electric signals from present bank components which is caused to be applied to said actuator is such that action caused to be developed by said actuator, is continuously simultaneously of essentially equal magnitude and one-hundred-eighty degrees out of phase with vibrations present at the source thereof, which vibrations are sensed by said first vibration sensor, such that the vibrations sensed by said second vibration sensor are of reduced magnitude as compared to the magnitude of vibrations sensed by said first vibration sensor.

23. A method of compensating vibrations in a vibrating system as in claim 21, in which the step of first causing the electric signal which exits said associated second band pass filter in each bank component to be phase matched with the electric signal exiting said associated first band pass filter at a bank component specific time phase instants is effected by causing a ramping voltage to be input to a voltage controlled oscillator, an output frequency of which is caused to be input to an all pass filter which reacts by imposing a phase shift to the signal exiting a band pass filter selected from the group consisting of said associated first and said second band pass filters, said ramping voltage being caused to remain at a level corresponding to said phase matched condition when a phase detector senses an in-phase condition at the output of said all pass filter and triggers a sample and hold circuit.

24. A method of compensating vibrations in a vibrating system as in claim 22, in which the step of first causing the electric signal which exits said associated second band pass filter in each bank component to be phase matched with the electric signal exiting said associated first band pass filter at a bank component specific time phase instants is effected by causing a ramping voltage to be input to a voltage controlled oscillator, an output frequency of which is caused to be input to an all pass filter which reacts by imposing a phase shift to the signal exiting a band pass filter selected from the group consisting of said associated first and said second band pass filters, said ramping voltage being caused to remain at a level corresponding to said phase matched condition when a phase detector senses an in-phase condition at the output of said all pass filter and triggers a sample and hold circuit.

25. A method of compensating vibrations in a vibrating system as in claim 21, wherein the step of causing, in each bank component, the electric signal exiting both the associated first and associated second band pass filters in each bank component to again be phase matched with one another, after causing gain to be imposed upon said electric signal which exits said associated first band pass filter and thereby, via a summation circuit and application of said signal to said actuator, causing the signal exiting said associated second band pass filter to become out of phase with said signal exiting said associated first band pass filter, which prior to application of gain was caused to be phase matched with the electric signal exiting said second associated band pass filter; is effected by causing a ramping voltage to be input to a voltage controlled oscillator, an output frequency of which is caused to be input to an all pass filter which reacts by imposing a phase shift to the signal exiting a band pass filter selected from the group consisting of said associated first and said second band pass filters, said ramping voltage being caused to remain at a level corresponding to said phase matched condition when a phase detector senses an in-phase condition at the input to said all pass filter and triggers a sample and hold circuit.

26. A method of compensating vibrations in a vibrating system as in claim 22, wherein the step of causing, in each bank component, the electric signal exiting both the associated first and associated second band pass filters in each bank component to again be phase matched with one another, after causing gain to be imposed upon said electric signal which exits said associated first band pass filter and thereby, via a summation circuit and application of said signal to said actuator, causing the signal exiting said associated second band pass filter to become out of phase with said signal exiting said associated first band pass filter, which prior to application of gain was caused to be phase matched with the electric signal exiting said associated second band pass filter; is effected by causing a phase detector to monitor said signals exiting said associated first and second associated band pass filters in each bank component, and effect, via an up/down counter and a digital to analog converter, an alternatingly upward and downward ramping voltage to be input to a voltage controlled oscillator, an output frequency of which is caused to be input to an all pass filter which reacts by imposing a phase shift to the signal exiting a band pass filter selected from the group consisting of said associated first and said second band pass filters, the upward and downward direction of said ramping voltage being determined by the relative phase between said signals detected by said phase detector at the input to said all pass filter.

* * * * *